(12) United States Patent
Kaneko

(10) Patent No.: US 10,386,885 B2
(45) Date of Patent: Aug. 20, 2019

(54) SEMICONDUCTOR DEVICE AND METHOD OF CONTROLLING SEMICONDUCTOR DEVICE

(71) Applicant: Sony Corporation, Tokyo (JP)

(72) Inventor: Tatsuya Kaneko, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/094,916

(22) PCT Filed: Jan. 27, 2017

(86) PCT No.: PCT/JP2017/002879
§ 371 (c)(1),
(2) Date: Oct. 19, 2018

(87) PCT Pub. No.: WO2017/187686
PCT Pub. Date: Nov. 2, 2017

(65) Prior Publication Data
US 2019/0094902 A1 Mar. 28, 2019

(30) Foreign Application Priority Data

Apr. 26, 2016 (JP) ................................ 2016-087855

(51) Int. Cl.
*G06F 1/04* (2006.01)
*H01L 21/822* (2006.01)
(Continued)

(52) U.S. Cl.
CPC .............. *G06F 1/04* (2013.01); *H01L 21/822* (2013.01); *H01L 27/04* (2013.01); *H03K 5/19* (2013.01)

(58) Field of Classification Search
CPC ......... G06F 1/04; H01L 21/822; H01L 27/04; H03K 5/19
(Continued)

(56) References Cited

U.S. PATENT DOCUMENTS

| 6,333,646 B1* | 12/2001 | Tsuzuki | G01R 31/30 327/40 |
| 2003/0016058 A1* | 1/2003 | Kakiuchi | H04M 1/505 327/46 |
| 2014/0184272 A1* | 7/2014 | Liu | G01R 23/15 327/42 |

FOREIGN PATENT DOCUMENTS

| JP | 62-136916 A | 6/1987 |
| JP | 63-306732 A | 12/1988 |

(Continued)

OTHER PUBLICATIONS

International Search Report and English translation thereof dated Apr. 4, 2017 in connection with International Application No. PCT/JP2017/002879.

(Continued)

*Primary Examiner* — Tomi Skibinski
(74) *Attorney, Agent, or Firm* — Wolf, Greenfield & Sacks, P.C.

(57) ABSTRACT

A failure state is correctly determined in a semiconductor device which operates in synchronization with a periodic signal.
A first periodic signal generation unit generates a first periodic signal. A second periodic signal generation unit generates a second periodic signal from the first periodic signal. A third periodic signal generation unit generates a third periodic signal from the first periodic signal. A determination unit determines whether or not a frequency ratio between a pair of periodic signals in a group is substantially constant for each of a group of the first and second periodic signals, a group of the second and third periodic signals, and a group of the first and third periodic signals. In a case where the ratio is not substantially constant in two groups, a failure part specification unit specifies the periodic signal generation unit corresponding to the periodic signal commonly (Continued)

included in the two groups of the first, second, and third periodic signal generation units as a failure part.

12 Claims, 22 Drawing Sheets

(51) Int. Cl.
  *H01L 27/04* (2006.01)
  *H03K 5/19* (2006.01)
(58) Field of Classification Search
  USPC ........................................ 327/39–49; 307/9.1
  See application file for complete search history.

(56) References Cited

FOREIGN PATENT DOCUMENTS

JP    08-119553 A    5/1996
WO    WO 99/59051 A1    11/1999

OTHER PUBLICATIONS

International Written Opinion and English translation thereof dated Apr. 4, 2017 in connection with International Application No. PCT/JP2017/002879.
International Preliminary Report on Patentability and English translation thereof dated Nov. 8, 2018 in connection with International Application No. PCT/JP2017/002879.

* cited by examiner

FIG. 9

| DETECTION ENABLE EN_D1 | DETERMINATION FLAG F_PLL·Xtal | DETERMINATION FLAG F_IMG·Xtal | DETERMINATION FLAG F_PLL·IMG | OPERATION OF FAILURE PART SPECIFICATION UNIT |
|---|---|---|---|---|
| 0 | — | — | — | F_PLL←0<br>F_IMG←0<br>F_Xtal←0 |
| 1 | 0<br>(PLL and Xtal<br>NORMAL) | 0<br>(IMG and Xtal<br>NORMAL) | 0<br>(PLL and IMG<br>NORMAL) | F_PLL←0<br>F_IMG←0<br>F_Xtal←0 |
| 1 | 1<br>(PLL or Xtal<br>FAILURE) | 0<br>(IMG and Xtal<br>NORMAL) | 1<br>(PLL or IMG<br>FAILURE) | F_PLL←1<br>(PLL FAILS) |
| 1 | 0<br>(PLL and Xtal<br>NORMAL) | 1<br>(IMG or Xtal<br>FAILURE) | 1<br>(PLL or IMG<br>FAILURE) | F_IMG←1<br>(IMG FAILS) |
| 1 | 1<br>(PLL or Xtal<br>FAILURE) | 1<br>(IMG or Xtal<br>FAILURE) | 0<br>(PLL and IMG<br>NORMAL) | F_Xtal←1<br>(Xtal FAILS) |

FIG. 11

| DETECTION ENABLE EN_D2 | DETERMINATION FLAG F_DIV1·DIV2 | DETERMINATION FLAG F_DIV2·DIV3 | DETERMINATION FLAG F_DIV1·DIV3 | OPERATION OF FAILURE PART SPECIFICATION UNIT |
|---|---|---|---|---|
| 0 | — | — | — | F_DIV1←0<br>F_DIV2←0<br>F_DIV3←0 |
| 1 | 0<br>(DIV1 and DIV2<br>NORMAL) | 0<br>(DIV2 and DIV3<br>NORMAL) | 0<br>(DIV1 and DIV3<br>NORMAL) | F_DIV1←0<br>F_DIV2←0<br>F_DIV3←0 |
| 1 | 1<br>(DIV1 or DIV2<br>FAILURE) | 0<br>(DIV2 and DIV3<br>NORMAL) | 1<br>(DIV1 or DIV3<br>FAILURE) | F_DIV1←1<br>(DIV1 FAILS) |
| 1 | 1<br>(DIV1 or DIV2<br>FAILURE) | 1<br>(DIV2 or DIV3<br>FAILURE) | 0<br>(DIV1 and DIV3<br>NORMAL) | F_DIV2←1<br>(DIV2 FAILS) |
| 1 | 0<br>(DIV1 and DIV2<br>NORMAL) | 1<br>(DIV2 or DIV3<br>FAILURE) | 1<br>(DIV1 or DIV3<br>FAILURE) | F_DIV3←1<br>(DIV3 FAILS) |

*FIG. 13*

| STATUS INFORMATION | |
|---|---|
| BLOCK | ERROR STATUS |
| IMAGING ELEMENT | NORMAL |
| PLL BLOCK | RECOVERING |
| FREQUENCY DIVIDER 1 | NORMAL |
| FREQUENCY DIVIDER 2 | OUT OF SERVICE |
| FREQUENCY DIVIDER 3 | NORMAL |
| CRYSTAL OSCILLATOR | NORMAL |

FIG. 22

| FrameInfoLine | |
|---|---|
| DATA NAME | PIXEL NUMBER |
| NUMBER OF DATA | 1 |
| FRAME COUNT | 2 |
| STATUS INFORMATION | 3 |
| INTERNAL INTEGRATED DATA | 4 TO 10 |
| ⋮ | ⋮ |

SEMICONDUCTOR DEVICE AND METHOD OF CONTROLLING SEMICONDUCTOR DEVICE

CROSS REFERENCE TO RELATED APPLICATIONS

This is a U.S. National Stage Application under 35 U.S.C. §371, based on International Application No. PCT/JP2017/002879, filed Jan. 27, 2017, which claims priority to Japanese Patent Application JP 2016-087855, filed Apr. 26, 2016, each of which is hereby incorporated by reference in its entirety.

TECHNICAL FIELD

The present technology relates to a semiconductor device and a method of controlling the semiconductor device. Specifically, this relates to a semiconductor device which operates in synchronization with a periodic signal and a method of controlling the semiconductor device.

BACKGROUND ART

Recently, demands for safety of automobiles in addition to performance, comfort, fuel economy and the like increases. In order to secure this safety, popularization of advanced driver assistance system (ADAS) is in progress. In this ADAS, a function that a semiconductor device activates a brake and the like when a sensor such as a radar or a camera detects an obstacle is realized. In such semiconductor device mounted on a vehicle, high reliability is generally required. In order to secure this reliability, a built-in self test (BIST) function of detecting a failure of the semiconductor device during operation is required.

For example, a semiconductor device which monitors a phase synchronization circuit which generates an operation clock by multiplying a reference clock from a crystal oscillator and detects a failure is proposed (for example, refer to Patent Document 1). This semiconductor device is based on the premise that the crystal oscillator does not fail; in a case where a ratio between a count value counted in synchronization with the reference clock and a count value counted in synchronization with the operation clock is not a multiplication ratio, this detects the failure of the phase synchronization circuit.

CITATION LIST

Patent Document

Patent Document 1: Japanese Patent Application Laid-Open No. 62-136916

SUMMARY OF THE INVENTION

Problems to be Solved by the Invention

However, since the above-described conventional technology is realized on the premise that the crystal oscillator does not fail, in a case where the failure occurs in the crystal oscillator, this is erroneously detected as a failure of the phase synchronization circuit. In order to avoid this erroneous detection, it is possible to determine that either the crystal oscillator or the phase synchronization circuit fails in a case where the ratio of the two count values is not a multiplication ratio, but only with the two count values, it is not possible to specify which of the crystal oscillator and the phase synchronization circuit fails. In this manner, the semiconductor device described above has a problem that it is not possible to correctly determine a failure state.

The present technology is achieved in view of such a situation, and an object thereof is to correctly determine the failure state in the semiconductor device which operates in synchronization with a periodic signal.

Solutions to Problems

The present technology is achieved in view of solving the above-described problem and a first aspect thereof is a semiconductor device provided with: a first periodic signal generation unit which generates a first periodic signal; a second periodic signal generation unit which generates a second periodic signal from the first periodic signal; a third periodic signal generation unit which generates a third periodic signal from the first periodic signal; a determination unit which determines whether or not a frequency ratio between a pair of periodic signals in a group is substantially constant for each of a group of the first and second periodic signals, a group of the second and third periodic signals, and a group of the first and third periodic signals; and a failure part specification unit which specifies the periodic signal generation unit corresponding to the periodic signal commonly included in two groups out of the first, second, and third periodic signal generation units as a failure part in a case where the ratio is not substantially constant in the two groups; and a method of controlling the same. This brings an effect that the failure part is specified in a case where the frequency ratio between a pair of periodic signals is not substantially constant in two groups.

Further, in the first aspect, a recovery processing unit which performs recovery processing of recovering the specified failure part may also be provided. This brings an effect that the failure part is recovered.

Furthermore, in the first aspect, a register which holds a set value of the ratio in the group for at least one of the groups is further provided, in which at least one of the first, second, and third periodic signal generation units may generate the periodic signal on the basis of the set value, and the recovery processing may include reset processing of allowing the register to hold again the set value. This brings an effect that the set value is held again in the register.

Furthermore, in the first aspect, a supplemental circuit which generates a supplemental periodic signal is further provided, in which the recovery processing may include switching processing of allowing the supplemental circuit to output the supplemental periodic signal to the determination unit in place of the periodic signal corresponding to the failure part out of the first, second, and third periodic signals. This brings an effect that the supplemental periodic signal is output in place of the periodic signal corresponding to the failure part.

Furthermore, in the first aspect, the determination unit may further determine whether or not the ratio is substantially constant for a group of a plurality of signals out of the first, second, and third periodic signals and the supplemental periodic signal, the failure part specification unit specifies any one of the first, second, and third periodic signal generation units and the supplemental circuit as the failure part, and the recovery processing unit allows the supplemental circuit to output the supplemental periodic signal to the determination unit in place of the periodic signal corresponding to the failure part out of the first, second, and third periodic signals in a case where the supplemental circuit is not failed. This brings an effect that the supplemental period signal is output in place of the periodic signal corresponding to the failure part in a case where the supplemental circuit does not fail.

Furthermore, in the first aspect, the recovery processing unit may perform the switching processing after the reset processing. This brings an effect that the switching processing is performed after the reset processing.

Furthermore, in the first aspect, a first counter which counts a first count value in synchronization with the first periodic signal; a second counter which counts a second count value in synchronization with the second periodic signal; and a third counter which counts a third count value in synchronization with the third periodic signal are further provided, in which the determination unit may determine whether or not a ratio between a pair of count values in a group is a substantially constant value for each of a group of the first and second count values, a group of the second and third count values, and a group of the first and third count values. This brings an effect that it is determined whether or not the ratio of the count values is the substantially constant value.

Furthermore, in the first aspect, an imaging unit which takes image data in synchronization with any one of the first, second, and third periodic signals; and a superimposition unit which superimposes information indicating the specified failure part on the image data may further be provided. This brings an effect that the information indicating the failure part is superimposed on the image data.

Furthermore, in the first aspect, at least one of the first, second, and third periodic signal generation units may be a phase synchronization signal. This brings an effect that the phase synchronization circuit is specified as the failure part.

Furthermore, in the first aspect, at least one of the first, second, and third periodic signal generation units may be a frequency divider. This brings an effect that the frequency divider is specified as the failure part.

Furthermore, in the first aspect, at least one of the first, second, and third periodic signal generation units may be a crystal oscillator. This brings an effect that the crystal oscillator is specified as the failure part.

Effects of the Invention

According to the present technology, it is possible to exert an excellent effect that it is possible to correctly determine the failure state in the semiconductor device which operates in synchronization with the periodic signal. Note that, the effects herein described are not necessarily limited and may be any of the effects described in the present disclosure.

BRIEF DESCRIPTION OF DRAWINGS

FIG. 9 is a view illustrating an example of operation of a failure part specification unit in the PLL group failure detection unit in the first embodiment of the present technology.

FIG. 11 is a view illustrating an example of operation of a failure part specification unit in the frequency divider block failure detection unit in the first embodiment of the present technology.

FIG. 13 is a view illustrating an example of a data configuration of status information in the first embodiment of the present technology.

FIG. 22 is a view illustrating an example of a storage place of status information in the second embodiment of the present technology.

MODE FOR CARRYING OUT THE INVENTION

Hereinafter, a mode for carrying out the present technology (hereinafter referred to as an embodiment) is described. The description is given in the following order.

1. First Embodiment (Example of Specifying Failure Part from Three or More Determination Flags)

2. Second Embodiment (Example of Specifying Failure Part from Three or More Determination Flags and Superimposing Information on Failure Part on Image Data)

1. First Embodiment

[Configuration Example of In-Vehicle Camera]

Figure 1:
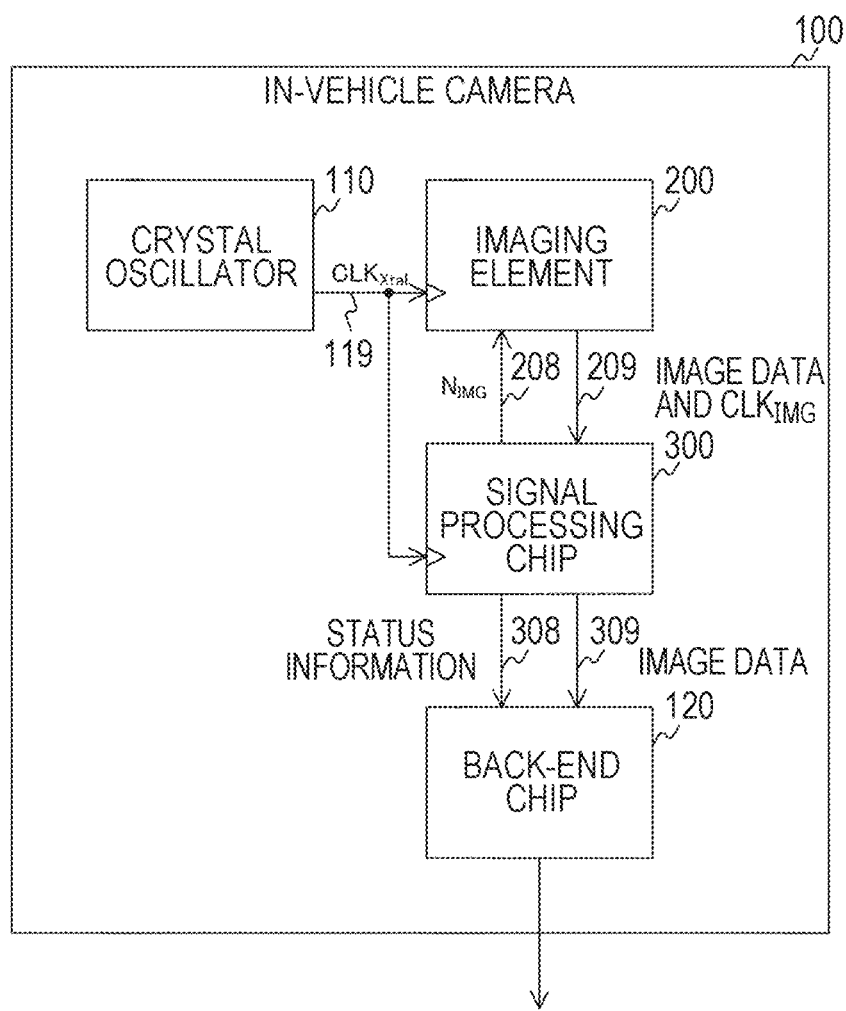
FIG. 1 is a block diagram illustrating a configuration example of an in-vehicle camera according to a first embodiment of the present technology.

FIG. 1 is a block diagram illustrating a configuration example of an in-vehicle camera 100 in a first embodiment. The in-vehicle camera 100 is a camera mounted on a vehicle and is provided with a crystal oscillator 110, an imaging element 200, a signal processing chip 300, and a back-end chip 120. Note that the in-vehicle camera 100 is an example of a semiconductor device recited in claims.

The crystal oscillator 110 generates a periodic signal of a constant frequency as a clock signal $CLK_{Xtal}$ by utilizing a piezoelectric effect of crystal. The crystal oscillator 110 supplies the clock signal $CLK_{Xtal}$ to the imaging element 200 and the signal processing chip 300 via a signal line 119. Note that the crystal oscillator 110 is an example of a first periodic signal generation unit recited in claims.

The imaging element 200 takes image data. The imaging element 200 internally generates a clock signal $CLK_{IMG}$ by multiplying the clock signal $CLK_{Xtal}$ by a multiplication ratio $1/N_{IMG}$. Here, $N_{IMG}$ being a predetermined real number is supplied to the imaging element 200 via a signal line 208 by the signal processing chip 300.

Then, the imaging element 200 takes the image data in synchronization with the internally generated clock signal $CLK_{IMG}$ and supplies the clock signal $CLK_{IMG}$ and the image data to the signal processing chip 300 via a signal line 209.

The signal processing chip 300 executes predetermined signal processing on the image data in synchronization with the clock signal $CLK_{Xtal}$. The signal processing chip 300 supplies the image data after the signal processing to the back-end chip 120 via a signal line 309. Furthermore, the signal processing chip 300 generates status information indicating a state of the in-vehicle camera 100 and supplies the same to the back-end chip 120 via a signal line 308. This status information includes an error status indicating presence or absence of a failure of the in-vehicle camera 100 and a failure part.

The back-end chip 120 analyzes the image data. In this analysis, for example, presence or absence of a pedestrian or an obstacle is determined. Then, the back-end chip 120 transmits an analysis result to a control circuit (not illustrated) for controlling a brake and a steering wheel. The control circuit controls the brake and the like on the basis of the analysis result of the image data. As a result, an ADAS function may be realized. Furthermore, the back-end chip 120 outputs a predetermined alarm signal to a display device (not illustrated) or a speaker (not illustrated) in a case where the status information indicates that the failure occurs in the in-vehicle camera 100. A driver is notified of content of the alarm signal by a display on the display device and an audio output of the speaker. Note that the back-end chip 120 may record the image data and the analysis result in a recording device, or may externally transmit the image data or the like via a communication interface.

Note that the crystal oscillator 110, the imaging element 200, the signal processing chip 300, and the back-end chip 120 are provided in the in-vehicle camera 100, but they may also be provided in electronic devices other than the in-vehicle camera 100 such as a personal computer and a smartphone.

Figure 2:
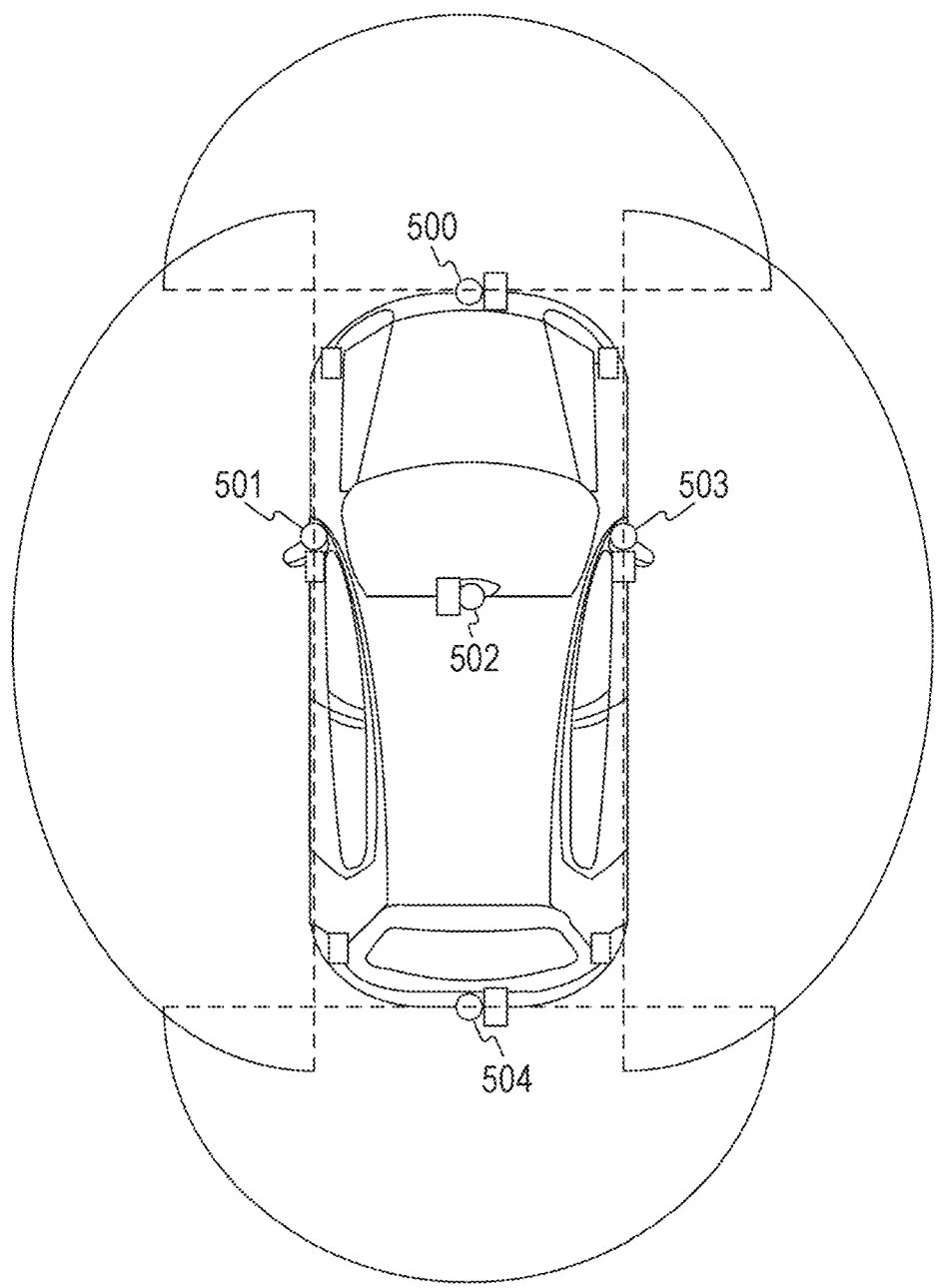
FIG. 2 is an example of a top view of a vehicle in the first embodiment of the present technology.

FIG. 2 is an example of a top view of the vehicle in the first embodiment. The in-vehicle camera 100 is attached to, for example, a mounting position 500 on a front side of the vehicle. Furthermore, cameras having the same configuration as that of the in-vehicle camera 100 are attached to mounting positions 501 and 503 on side surfaces of the vehicle. Furthermore, cameras having the same configuration as that of the in-vehicle camera 100 are attached to a mounting position 502 on an upper side of the vehicle and a mounting position 504 on a rear side of the vehicle. Note that although the cameras are mounted on all of the mounting positions, they may also be mounted only on some of them.

[Configuration Example of Imaging Element]

Figure 3:
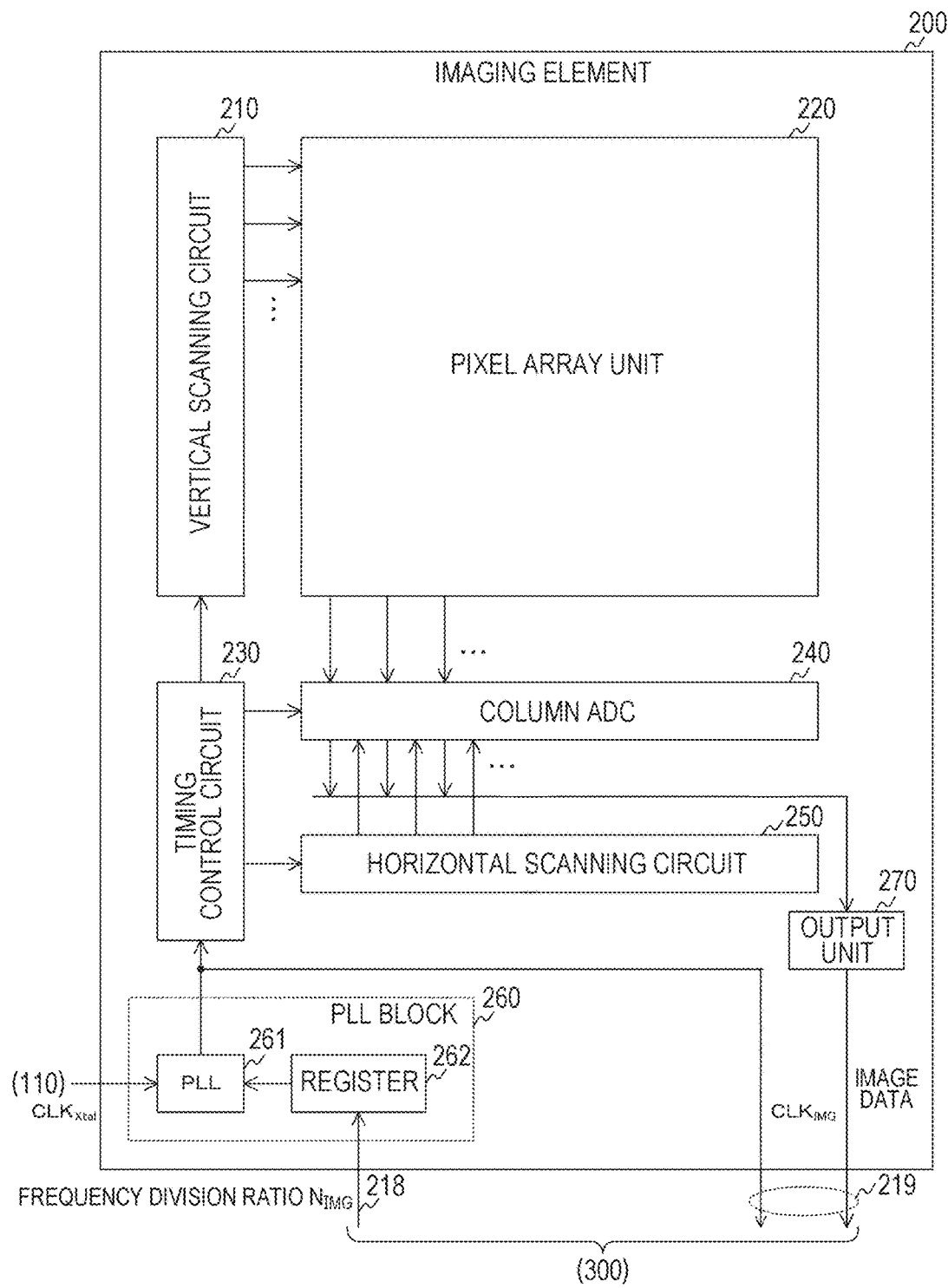
FIG. 3 is a block diagram illustrating a configuration example of an imaging element in the first embodiment of the present technology.

FIG. 3 is a block diagram illustrating a configuration example of the imaging element 200 in the first embodiment. The imaging element 200 is provided with a vertical scanning circuit 210, a pixel array unit 220, a timing control circuit 230, a column analog-to-digital converter (ADC) 240, and a horizontal scanning circuit 250. Furthermore, the imaging element 200 is provided with a phase locked loop (PLL) block 260 and an output unit 270. The PLL block 260 is provided with a PLL 261 and a register 262.

The register 262 holds a frequency division ratio $N_{IMG}$ from the signal processing chip 300. The PLL 261 multiplies the clock signal $CLK_{Xtal}$. The PLL 261 reads out the frequency division ratio $N_{IMG}$ from the register 262 and multiplies the clock signal $CLK_{Xtal}$ by the multiplication ratio $1/N_{IMG}$ to generate the clock signal $CLK_{IMG}$. The multiplication ratio $1/N_{IMG}$ is set to a value not smaller than 1. The same applies to other multiplication ratios to be described later. Then, the PLL 261 supplies the clock signal $CLK_{IMG}$ to the timing control circuit 230 and the signal processing chip 300. Note that the PLL 261 is an example of a third periodic signal generation unit recited in claims.

In the pixel array unit 220, a plurality of pixel circuits is arranged in a two-dimensional lattice pattern. Hereinafter, a set of pixel circuits arranged in a predetermined direction is referred to as a "row", and a set of pixel circuits arranged in a direction perpendicular to the direction is referred to as a "column".

The timing control circuit 230 controls the vertical scanning circuit 210, the column ADC 240, and the horizontal scanning circuit 250 in synchronization with the clock signal $CLK_{IMG}$.

The vertical scanning circuit 210 selects a row under the control of the timing control circuit 230 and drives the same.

The column ADC 240 is provided with an ADC for each column. The ADC AD converts a pixel signal from a corresponding column to a digital signal. The ADC supplies the AD converted signal to the output unit 270 as pixel data under the control of the horizontal scanning circuit 250.

The horizontal scanning circuit 250 selects a column under the control of the timing control circuit 230 and drives the ADC of the selected column.

The output unit 270 outputs the image data including the pixel data to the signal processing chip 300.

Note that a circuit including the vertical scanning circuit 210, the pixel array unit 220, the timing control circuit 230, the column ADC 240, the horizontal scanning circuit 250, and the output unit 270 is an example of an imaging unit recited in claims.

[Configuration Example of Signal Processing Chip]

Figure 4:
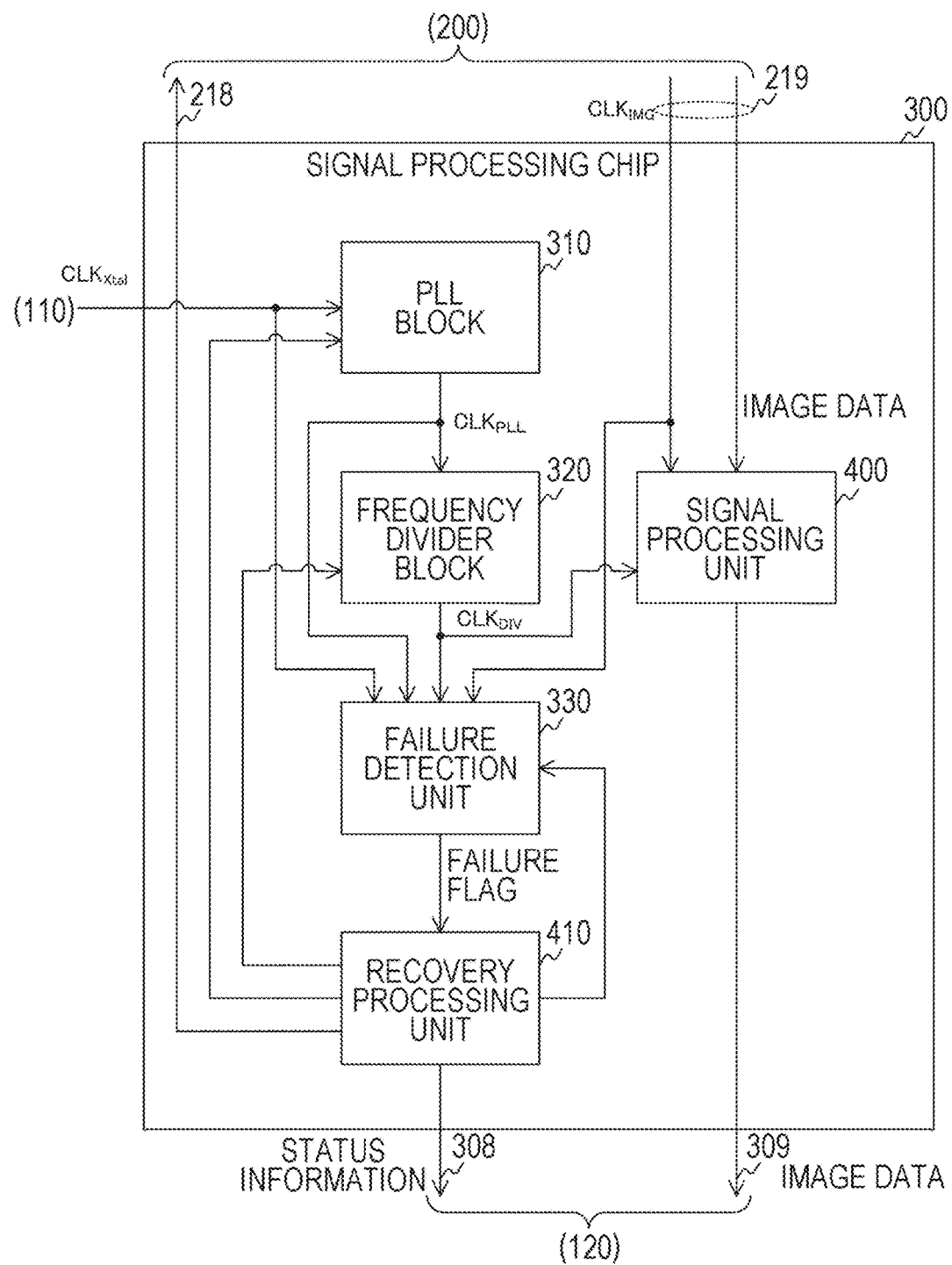
FIG. 4 is a block diagram illustrating a configuration example of a signal processing chip in the first embodiment of the present technology.

FIG. 4 is a block diagram illustrating a configuration example of the signal processing chip 300 in the first embodiment. The signal processing chip 300 is provided with a PLL block 310, a frequency divider block 320, a failure detection unit 330, a signal processing unit 400, and a recovery processing unit 410.

The PLL block 310 multiplies the clock signal $CLK_{Xtal}$. The PLL block 310 supplies the multiplied signal to the frequency divider block 320 as a clock signal $CLK_{PLL}$.

The frequency divider block 320 frequency-divides the clock signal $CLK_{PLL}$. This frequency divider block 320 supplies the frequency-divided signal to the failure detection unit 330 and the signal processing unit 400 as a clock signal $CLK_{DIV}$. The clock signal $CLK_{DIV}$ includes three clock signals and is transmitted through three signal lines. In FIG. 4, for convenience of illustration, these three signal lines are collectively illustrated as one line.

The signal processing unit 400 performs predetermined signal processing on the image data. The signal processing unit 400 performs a plurality of types of signal processing such as correlated double sampling (CDS) processing, white balance processing, and synthesis processing. As the synthesis processing, three-dimensional noise reduction, wide dynamic range synthesis and the like are executed. Each signal processing is executed in synchronization with the clock signal $CLK_{IMG}$ and the clock signal $CLK_{DIV}$. The signal processing unit 400 supplies the image data after the signal processing to the back-end chip 120.

The failure detection unit 330 detects the failure occurring in the in-vehicle camera 100. The failure detection unit 330 detects the failure for each of blocks to be monitored on the basis of the clock signals $CLK_{Xtal}$, $CLK_{PLL}$, $CLK_{DIV}$, and $CLK_{IMG}$ at predetermined detection timing. The blocks to be monitored are, for example, the crystal oscillator 110, the imaging element 200, the PLL block 310, and the frequency divider block 320. The failure detection unit 330 generates a failure flag indicating whether there is a failure for each block to be monitored and supplies the same to the recovery processing unit 410.

The recovery processing unit 410 performs processing of recovering the failure part. A function of the recovery processing unit 410 is realized by, for example, a central processing unit (CPU) executing a program. Furthermore, the recovery processing unit 410 generates the status information and supplies the same to the back-end chip 120.

[Configuration Example of PLL Block]

Figure 5:
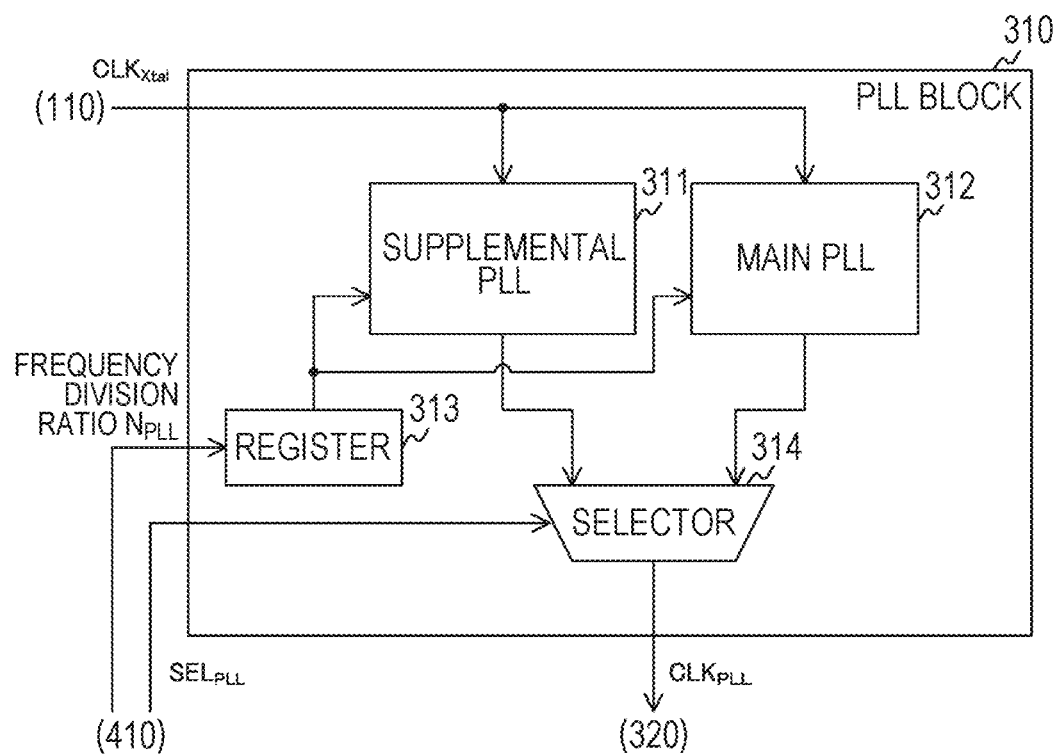
FIG. 5 is a block diagram illustrating a configuration example of a PLL block in the first embodiment of the present technology.

FIG. 5 is a block diagram illustrating a configuration example of the PLL block 310 in the first embodiment. The PLL block 310 is provided with a supplemental PLL 311, a main PLL 312, a register 313, and a selector 314.

The register 313 holds a frequency division ratio $N_{PLL}$. The frequency division ratio $N_{PLL}$ is a predetermined real number and is supplied from the recovery processing unit 410.

The supplemental PLL 311 multiplies the clock signal $CLK_{Xtal}$. The supplemental PLL 311 reads out the frequency division ratio $N_{PLL}$ from the register 313 and multiplies the clock signal $CLK_{Xtal}$ by a multiplication ratio $1/N_{PLL}$ to generate a clock signal $CLK_{PLL\_S}$. Then, the supplemental PLL 311 supplies the clock signal $CLK_{PLL\_S}$ to the selector 314. Note that the supplemental PLL 311 is an example of a supplemental circuit recited in claims.

The main PLL 312 multiplies the clock signal $CLK_{Xtal}$. The main PLL 312 reads out the frequency division ratio $N_{PLL}$ from the register 313 and multiplies the clock signal $CLK_{Xtal}$ by the multiplication ratio $1/N_{PLL}$ to generate a clock signal $CLK_{PLL\_M}$. Then, the main PLL 312 supplies the clock signal $CLK_{PLL\_M}$ to the selector 314. Note that the main PLL 312 is an example of a second periodic signal generation unit recited in claims.

The selector 314 selects either the clock signal $CLK_{PLL\_M}$ or the clock signal $CLK_{PLL\_S}$ in accordance with a selection signal $SEL_{PLL}$ from the recovery processing unit 410. The selector 314 supplies the selected signal to the frequency divider block 320 as a clock signal $CLK_{PLL}$.

[Configuration Example of Frequency Divider Block]

Figure 6:
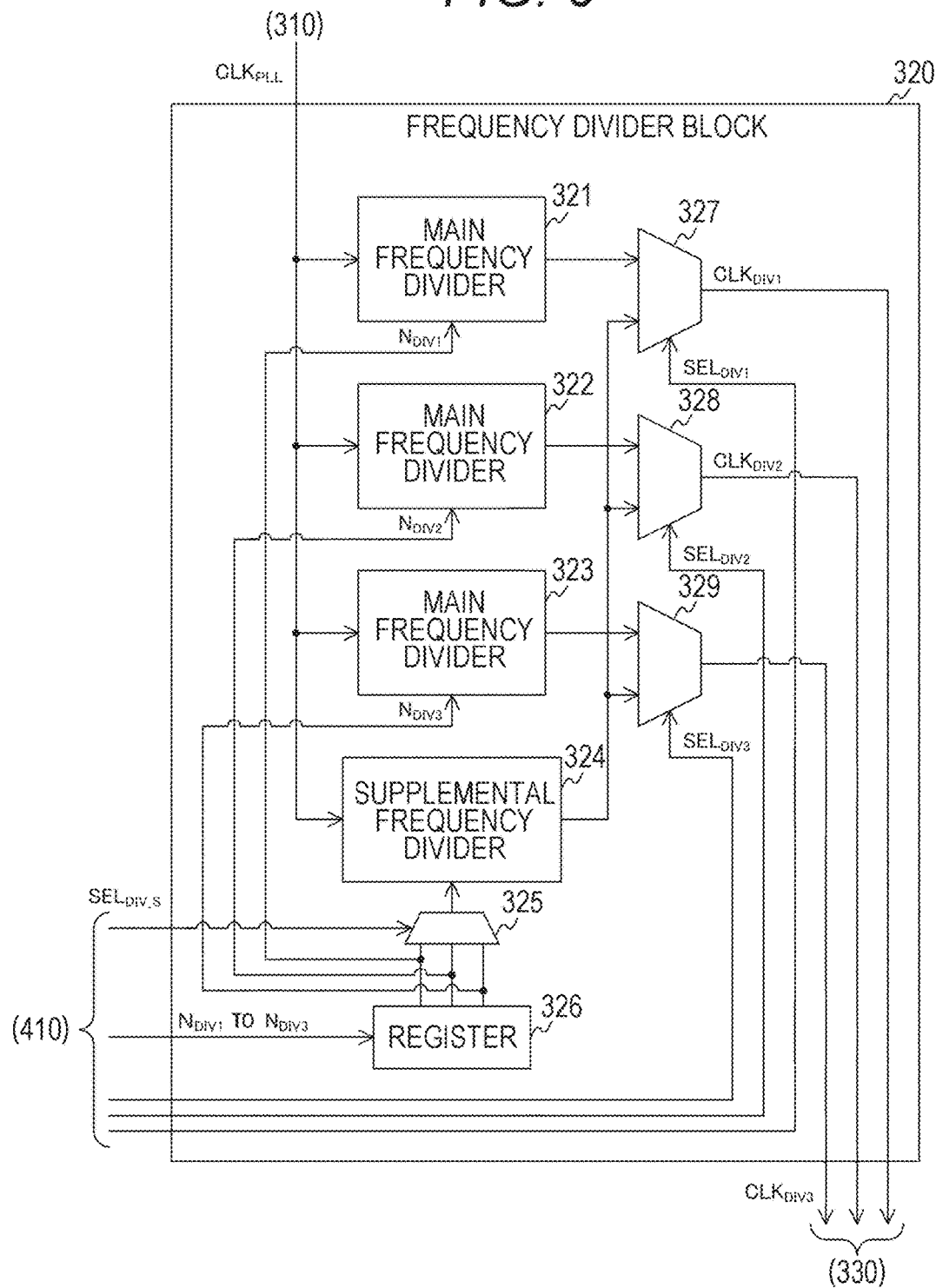
FIG. 6 is a block diagram illustrating a configuration example of a frequency divider block in the first embodiment of the present technology.

FIG. 6 is a block diagram illustrating a configuration example of the frequency divider block 320 in the first embodiment. The frequency divider block 320 is provided with main frequency dividers 321, 322, and 323, a supplemental frequency divider 324, a register 326, and selectors 325, 327, 328, and 329.

The register 326 holds frequency division ratios $N_{DIV1}$, $N_{DIV2}$, and $N_{DIV3}$. These frequency division ratios are predetermined real numbers and are supplied from the recovery processing unit 410. Note that the frequency division ratios $N_{DIV1}$, $N_{DIV2}$, and $N_{DIV3}$ are held by one register 326, but they may also be held in a dispersed manner by a plurality of registers.

The main frequency divider 321 frequency-divides the clock signal $CLK_{PLL}$. The main frequency divider 321 reads out the frequency division ratio $N_{DIV1}$ from the register 326, frequency-divides the clock signal $CLK_{PLL}$ by the frequency division ratio, and generates a clock signal $CLK_{DIV1\_M}$. Then, the main frequency divider 321 supplies the clock signal $CLK_{DIV1\_M}$ to the selector 327. Note that the main frequency divider 321 is an example of a first periodic signal generation unit recited in claims.

The main frequency divider 322 is similar to the main frequency divider 321 except that this frequency-divides by the frequency division ratio $N_{DIV2}$. The main frequency divider 322 supplies the frequency-divided signal to the selector 328 as a clock signal $CLK_{DIV2\_M}$. Note that the main frequency divider 322 is an example of a second periodic signal generation unit recited in claims.

The main frequency divider 323 is similar to the main frequency divider 321 except that this frequency-divides by the frequency division ratio $N_{DIV3}$. The main frequency divider 323 supplies the frequency-divided signal to the selector 329 as a clock signal $CLK_{DIV3\_M}$. Note that the main frequency divider 323 is an example of a third periodic signal generation unit recited in claims.

The supplemental frequency divider 324 is similar to the main frequency divider 321 except that this frequency-divides by the frequency division ratio from the selector 325. The supplemental frequency divider 324 supplies the frequency-divided signal to the selectors 327, 328, and 329 as a clock signal $CLK_{DIV\_S}$. Note that the supplemental frequency divider 324 is an example of a supplemental circuit recited in claims.

The selector 325 supplies any one of the frequency division ratios $N_{DIV1}$, $N_{DIV2}$, and $N_{DIV3}$ to the supplemental frequency divider 324 in accordance with a selection signal $SEL_{DIV\_S}$ from the recovery processing unit 410.

The selector 327 selects either the clock signal $CLK_{DIV1\_M}$ or the clock signal $CLK_{DIV\_S}$ according to a selection signal $SEL_{DIV1}$ from the recovery processing unit 410. The selector 327 outputs the selected signal to the failure detection unit 330 and the signal processing unit 400 as a clock signal $CLK_{DIV1}$.

The selector 328 selects either the clock signal $CLK_{DIV2\_M}$ or the clock signal $CLK_{DIV\_S}$ in accordance with a selection signal $SEL_{DIV2}$ from the recovery processing unit 410. The selector 328 outputs the selected signal to the failure detection unit 330 and the like as a clock signal $CLK_{DIV2}$.

The selector 329 selects either the clock signal $CLK_{DIV3\_M}$ or the clock signal $CLK_{DIV\_S}$ in accordance with a selection signal $SEL_{DIV3}$ from the recovery processing unit 410. The selector 329 outputs the selected signal to the failure detection unit 330 and the like as a clock signal $CLK_{DIV3}$.

[Configuration Example of Failure Detection Unit]

Figure 7:
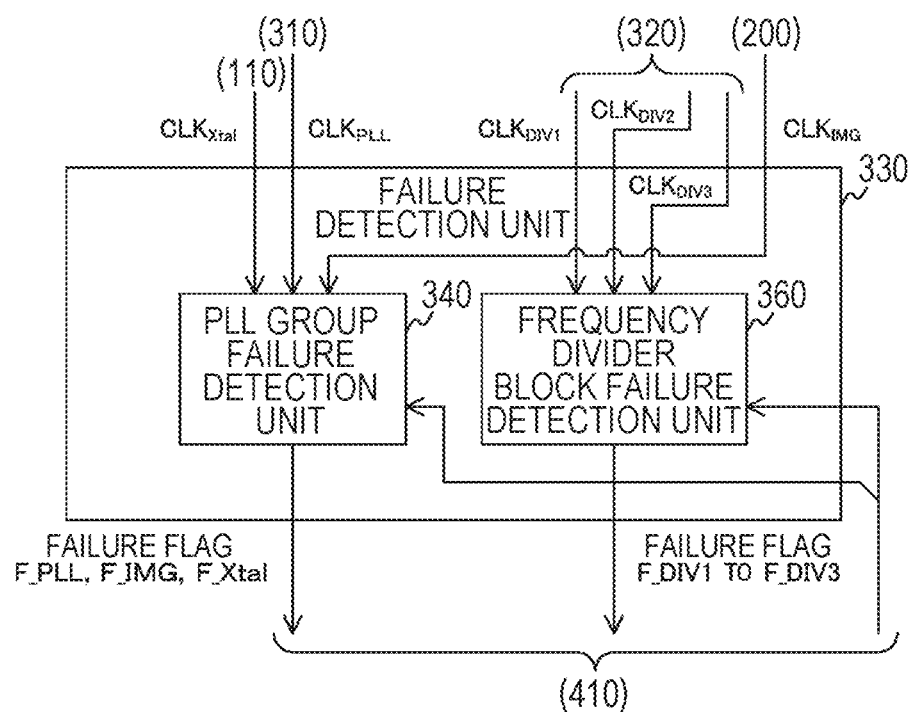
FIG. 7 is a block diagram illustrating a configuration example of a failure detection unit in the first embodiment of the present technology.

FIG. 7 is a block diagram illustrating a configuration example of the failure detection unit 330 in the first embodiment. The failure detection unit 330 is provided with a PLL group failure detection unit 340 and a frequency divider block failure detection unit 360.

The PLL group failure detection unit 340 detects a failure for each of the PLL block 310, the imaging element 200, and the crystal oscillator 110. The PLL group failure detection unit 340 generates failure flags F_PLL, F_IMG, and F_Xtal from the clock signals $CLK_{Xtal}$, $CLK_{PLL}$, and $CLK_{IMG}$, and supplies them to the recovery processing unit 410. Here, the failure flag F_PLL indicates whether there is the failure in the PLL block 310. Furthermore, the failure flag F_IMG indicates whether there is the failure in the imaging element 200, and the failure flag F_Xtal indicates whether there is the failure in the crystal oscillator 110.

The frequency divider block failure detection unit 360 detects a failure for each of the main frequency dividers 321, 322, and 323 in the frequency divider block 320. The frequency divider block failure detection unit 360 generates failure flags F_DIV1, F_DIV2, and F_DIV3 from the clock signals $CLK_{DIV1}$, $CLK_{DIV2}$, and $CLK_{DIV3}$, and supplies them to the recovery processing unit 410. Here, the failure flag F_DIV1 indicates whether there is a failure in the main frequency divider 321. Furthermore, the failure flag F_DIV2 indicates whether there is a failure in the main frequency divider 322, and the failure flag F_DIV3 indicates whether there is a failure in the main frequency divider 323.

[Configuration Example of PLL Group Failure Detection Unit]

Figure 8:
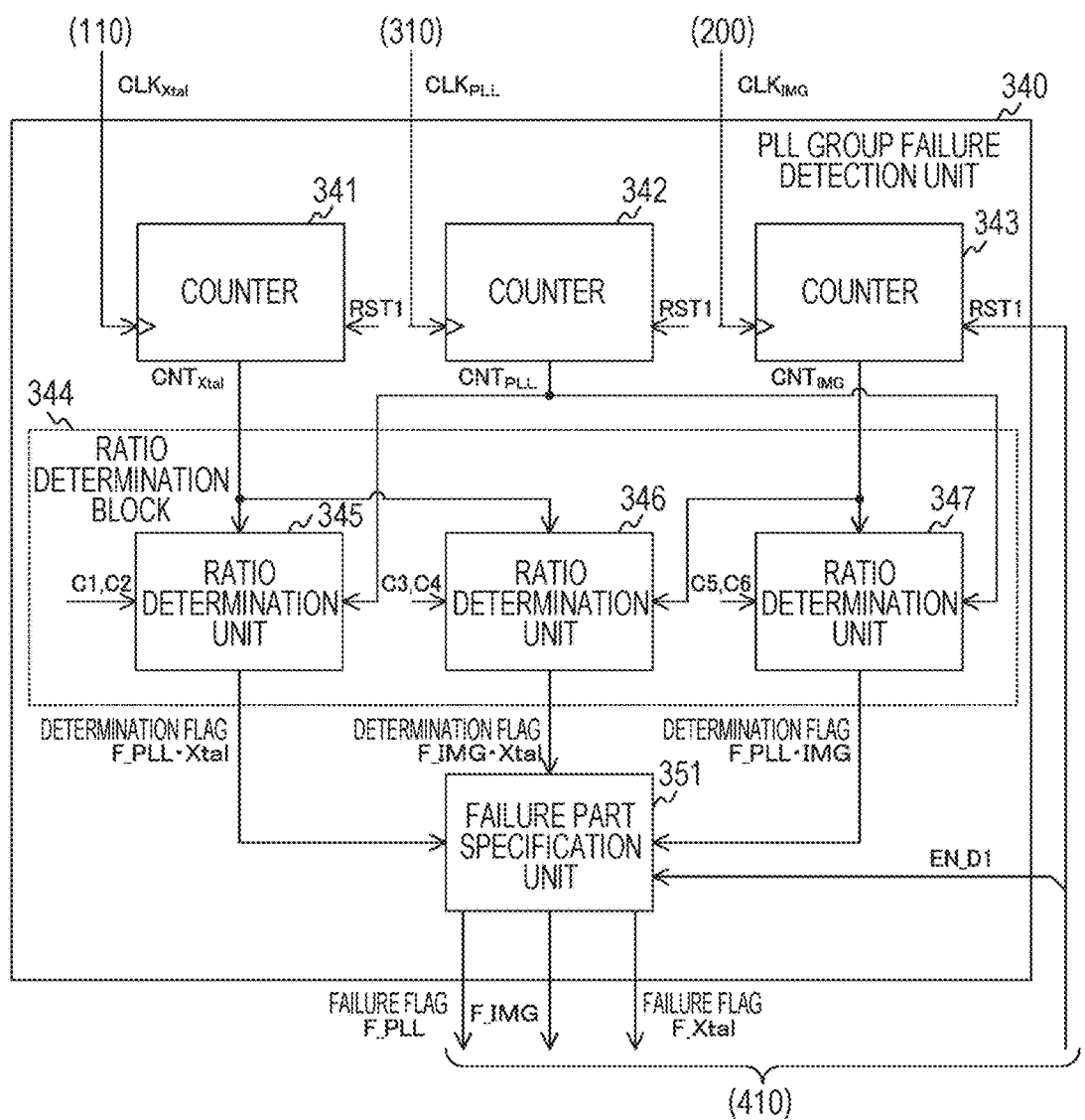
FIG. 8 is a block diagram illustrating a configuration example of a PLL group failure detection unit in the first embodiment of the present technology.

FIG. 8 is a block diagram illustrating a configuration example of the PLL group failure detection unit 340 in the first embodiment. The PLL group failure detection unit 340 is provided with counters 341, 342, and 343, a ratio determination block 344, and a failure part specification unit 351.

The counter 341 counts a count value $CNT_{Xtal}$ in synchronization with the clock signal $CLK_{Xtal}$ from the crystal oscillator 110. This counter 341 supplies the count value $CNT_{Xtal}$ to the ratio determination block 344. Note that the counter 341 is an example of a first counter recited in claims.

The counter 342 counts the count value $CNT_{PLL}$ in synchronization with the clock signal $CLK_{PLL}$ from the PLL block 310. This counter 342 supplies the count value $CNT_{PLL}$ to the ratio determination block 344. Note that the counter 342 is an example of a second counter recited in claims.

The counter 343 counts the count value $CNT_{IMG}$ in synchronization with the clock signal $CLK_{IMG}$ from the imaging element 200. This counter 343 supplies the count value $CNT_{IMG}$ to the ratio determination block 344. Note that the counter 343 is an example of a third counter recited in claims.

Furthermore, when a reset signal RST1 generated by the recovery processing unit 410 is input, the counters 341, 342, and 343 set the count value to an initial value. Timing of the initialization may be arbitrarily set by a designer or a user. For example, in conjunction with detection enable EN_D1 described above, the recovery processing unit 410 generates the reset signal RST1.

The ratio determination block 344 determines whether or not the ratio is a substantially constant value for each of a group of the count values $CNT_{Xtal}$ and $CNT_{PLL}$, a group of the count values $CNT_{PLL}$ and $CNT_{IMG}$, and a group of the count values $CNT_{IMG}$ and $CNT_{Xtal}$. The ratio determination block 344 is provided with ratio determination units 345, 346, and 347.

The ratio determination unit 345 determines whether or not a ratio between the count value $CNT_{Xtal}$ and the count value $CNT_{PLL}$ is a substantially constant value at predetermined timing (timing when the count value $CNT_{Xtal}$ is a set value C1 and the like).

For example, the ratio determination unit 345 determines whether or not $CNT_{PLL}/CNT_{Xtal}$ falls within a range of (C2/C1)±α1 (in other words, whether or not this is a substantially constant value). The ratio determination unit 345 supplies a determination flag F_PLL·Xtal indicating a determination result to the failure part specification unit 351. The determination flag F_PLL·Xtal indicates whether or not a frequency ratio between the clock signal $CLK_{PLL}$ and the clock signal $CLK_{Xtal}$ is a substantially constant value. In a case where the ratio is not the substantially constant value, it is assumed that the crystal oscillator 110 or the PLL block 310 is stopped or a relationship between the frequencies generated by them is broken. Therefore, it is treated as the failure of either the crystal oscillator 110 or the PLL block 310.

The set values C1 and C2 are set to values the ratio between which is the multiplication ratio $1/N_{PLL}$ of the PLL block 310. For example, in a case where the multiplication ratio $1/N_{PLL}$ is "5", values with which C2/C1 becomes "5" are set.

The ratio determination unit 346 determines whether or not a ratio between the count value $CNT_{Xtal}$ and the count value $CNT_{IMG}$ is a substantially constant value at predetermined timing.

For example, the ratio determination unit 346 determines whether or not $CNT_{IMG}/CNT_{Xtal}$ falls within a range of (C4/C3)±α2. The ratio determination unit 346 supplies a determination flag F_IMG·Xtal indicating a determination result to the failure part specification unit 351. The determination flag F_IMG·Xtal indicates whether or not the frequency ratio between the clock signal $CLK_{IMG}$ and the clock signal $CLK_{Xtal}$ is a substantially constant value. In a case where the ratio is not the substantially constant value, the failure of either the crystal oscillator 110 or the imaging element 200 is assumed.

The set values C3 and C4 are set to values the ratio between which is the multiplication ratio $1/N_{IMG}$ of the imaging element 200.

The ratio determination unit 347 determines whether or not a ratio between the count value $CNT_{PLL}$ and the count value $CNT_{IMG}$ is a substantially constant value at predetermined timing.

For example, the ratio determination unit 347 determines whether or not $CNT_{PLL}/CNT_{IMG}$ falls within a range of (C6/C5)±α3. The ratio determination unit 347 supplies a determination flag F_PLL·IMG indicating a determination result to the failure part specification unit 351. The determination flag F_PLL·IMG indicates whether or not the frequency ratio between the clock signal $CLK_{PLL}$ and the clock signal $CLK_{IMG}$ is a substantially constant value. In a case where the ratio is not the substantially constant value, the failure of either the PLL block 310 or the imaging element 200 is assumed.

The set values C5 and C6 are set to values the ratio between which is the frequency ratio between the clock signals $CLK_{IMG}$ and $CLK_{PLL}$ in an ideal state without failure. For example, in a case where the frequency of the clock signal $CLK_{IMG}$ in the ideal state is 10 megahertz (MHz) and the frequency of the clock signal $CLK_{PLL}$ in the ideal state is 20 megahertz (MHz), values with which C6/C5 becomes "2" are set. Note that in a case where the frequencies of the ideal clock signals $CLK_{IMG}$ and $CLK_{PLL}$ are the same, either C5 or C6 is commonly set in the ratio determination unit 347.

The failure part specification unit 351 specifies the failure part when the failure occurs in any one of the crystal oscillator 110, the PLL block 310, and the imaging element 200. The detection enable EN_D1 generated by the recovery processing unit 410 is input to the failure part specification unit 351. The detection enable EN_D1 is a signal indicating whether or not to operate the failure part specification unit 351. The detection enable EN_D1 is set to be enabled at timing of detecting the failure.

In a case where the detection enable EN_D1 is enabled, the failure part specification unit 351 generates the failure flags F_PLL, F_IMG, and F_Xtal from the three determination flags and supplies them to the recovery processing unit 410.

FIG. 9 is a view illustrating an example of operation of the failure part specification unit 351 in the PLL group failure detection unit in the first embodiment. In a case where the detection enable EN_D1 is "0" (disabled), the failure part specification unit 351 sets all the failure flags F_PLL, F_IMG, and F_Xtal to "0" (without failure).

Furthermore, in a case where the detection enable EN_D1 is "1" (enabled) and all the determination flags are "0", the failure part specification unit 351 sets all the failure flags F_PLL, F_IMG, and F_Xtal to "0" (without failure).

Here, the determination flag is set to "0" in a case where the frequency ratio between a pair of clock signals to be monitored is substantially constant, and set to "1" otherwise. Furthermore, it is assumed that two or more of the crystal oscillator 110, the imaging element 200, and the PLL block 310 do not fail at the same time.

In a case where the detection enable EN_D1 is "1" and only the determination flags F_PLL·Xtal and F_PLL·IMG are "1", the failure part specification unit 351 sets only the failure flag F_PLL to "1" (with failure).

As described above, in a case where the determination flag F_PLL·Xtal is "1", the failure of either the crystal oscillator 110 or the PLL block 310 is estimated. Furthermore, in a case where the determination flag F_PLL·IMG is "1", the failure of either the PLL block 310 or the imaging element 200 is estimated. Accordingly, the failure part specification unit 351 may determine that the failure occurs in the PLL block 310 common to the determination flags.

Furthermore, in a case where the detection enable EN_D1 is "1" and only the determination flags F_IMG·Xtal and F_PLL·IMG are "1", the failure part specification unit 351 sets only the failure flag F_IMG to "1" (with failure). In a case where the detection enable EN_D1 is "1" and only the determination flags F_PLL·Xtal and F_IMG·Xtal are "1", the failure part specification unit 351 sets only the failure flag F_Xtal to "1" (with failure).

Assuming that the two or more of the three blocks to be monitored do not fail at the same time in this manner, when any one circuit fails, the two determination flags corresponding to the failure part are set to "1", and the remaining determination flag is set to "0". Therefore, the failure part specification unit 351 may specify the failure part from a combination of the two determination flags which are set to "1". Note that although PLL group failure detection unit 340 specifies the failure part out of the three blocks from the three determination flags, this may also specify the failure part out of four or more blocks from four or more determination flags. The same applies to the frequency divider block failure detection unit 360.

[Configuration Example of Frequency Divider Block Failure Detection Unit]

Figure 10:
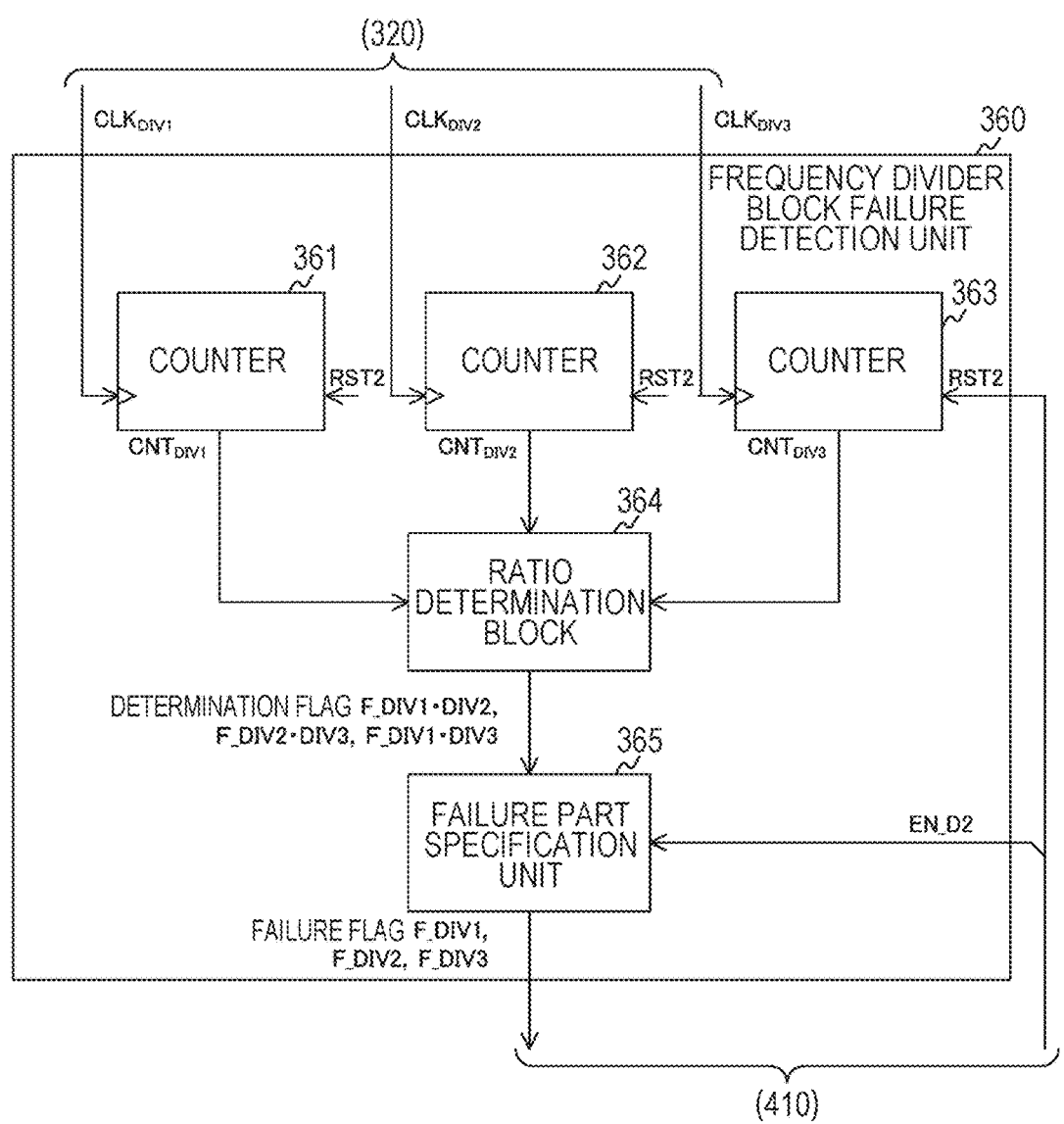
FIG. 10 is a block diagram illustrating a configuration example of a frequency divider block failure detection unit in the first embodiment of the present technology.

FIG. 10 is a block diagram illustrating a configuration example of the frequency divider block failure detection unit 360 in the first embodiment. The frequency divider block failure detection unit 360 is provided with counters 361, 362, and 363, a ratio determination block 364, and a failure part specification unit 365.

The counter 361 counts a count value $CNT_{DIV1}$ in synchronization with the clock signal $CLK_{DIV1}$ from the frequency divider block 320. The counter 361 supplies the count value $CNT_{DIV1}$ to the ratio determination block 364. Note that the counter 361 is an example of a first counter recited in claims.

The counter 362 counts a count value $CNT_{DIV2}$ in synchronization with the clock signal $CLK_{DIV2}$ from the frequency divider block 320. The counter 362 supplies the count value $CNT_{DIV2}$ to the ratio determination block 364. Note that the counter 362 is an example of a second counter recited in claims.

The counter 363 counts a count value $CNT_{DIV3}$ in synchronization with the clock signal $CLK_{DIV3}$ from the frequency divider block 320. The counter 363 supplies the count value $CNT_{DIV3}$ to the ratio determination block 364. Note that counter 363 is an example of a third counter recited in claims.

Furthermore, when a reset signal RST2 generated by the recovery processing unit 410 is input, the counters 361, 362, and 363 set the count value to the initial value. For example, the recovery processing unit 410 generates the reset signal RST2 in conjunction with detection enable EN_D2 described above.

The ratio determination block 364 determines whether or not the ratio is a substantially constant value for each of a group of the count values $CNT_{DIV1}$ and $CNT_{DIV2}$, a group of the count values $CNT_{DIV2}$ and $CNT_{DIV3}$, and a group of the count values $CNT_{DIV1}$ and $CNT_{DIV3}$. The ratio determination block 364 supplies determination flags F_DIV1·DIV2, F_DIV2·DIV3, and F_DIV1·DIV3 indicating the determination results to the failure part specification unit 365.

In a case where the detection enable EN_D2 is enabled, the failure part specification unit 365 generates the failure flags F_DIV1, F_DIV2, and F_DIV3 from the three determination flags and supplies them to the recovery processing unit 410.

FIG. 11 is a view illustrating an example of operation of the failure part specification unit 365 in the frequency divider block failure detection unit 360 in the first embodiment.

In a case where the detection enable EN_D2 is "0" (disabled), the failure part specification unit 365 sets all the failure flags F_DIV1, F_DIV2, and F_DIV3 to "0" (without failure).

Furthermore, in a case where the detection enable EN_D2 is "1" (enabled) and all the determination flags are "0", the failure part specification unit 351 sets all the failure flags F_DIV1, F_DIV2, and F_DIV3 to "0" (without failure).

In a case where the detection enable EN_D2 is "1" and only the determination flags F_DIV1·DIV2 and F_DIV1·DIV3 are "1", the failure part specification unit 351 sets only the failure flag F_DIV1 to "1" (with failure).

Furthermore, in a case where the detection enable EN_D2 is "1" and only the determination flags F_DIV1·DIV2 and F_DIV2·DIV3 are "1", the failure part specification unit 365 sets only the failure flag F_DIV2 to "1" (with failure). In a case where the detection enable EN_D1 is "1" and only the determination flags F_DIV2·DIV3 and F_DIV1·DIV3 are "1", the failure part specification unit 365 sets only the failure flag F_DIV3 to "1" (with failure).

In this manner, the failure part specification unit 365 may specify the one in which the failure occurs out of the three frequency dividers in the frequency divider block 320 from the three determination flags.

Figure 12:
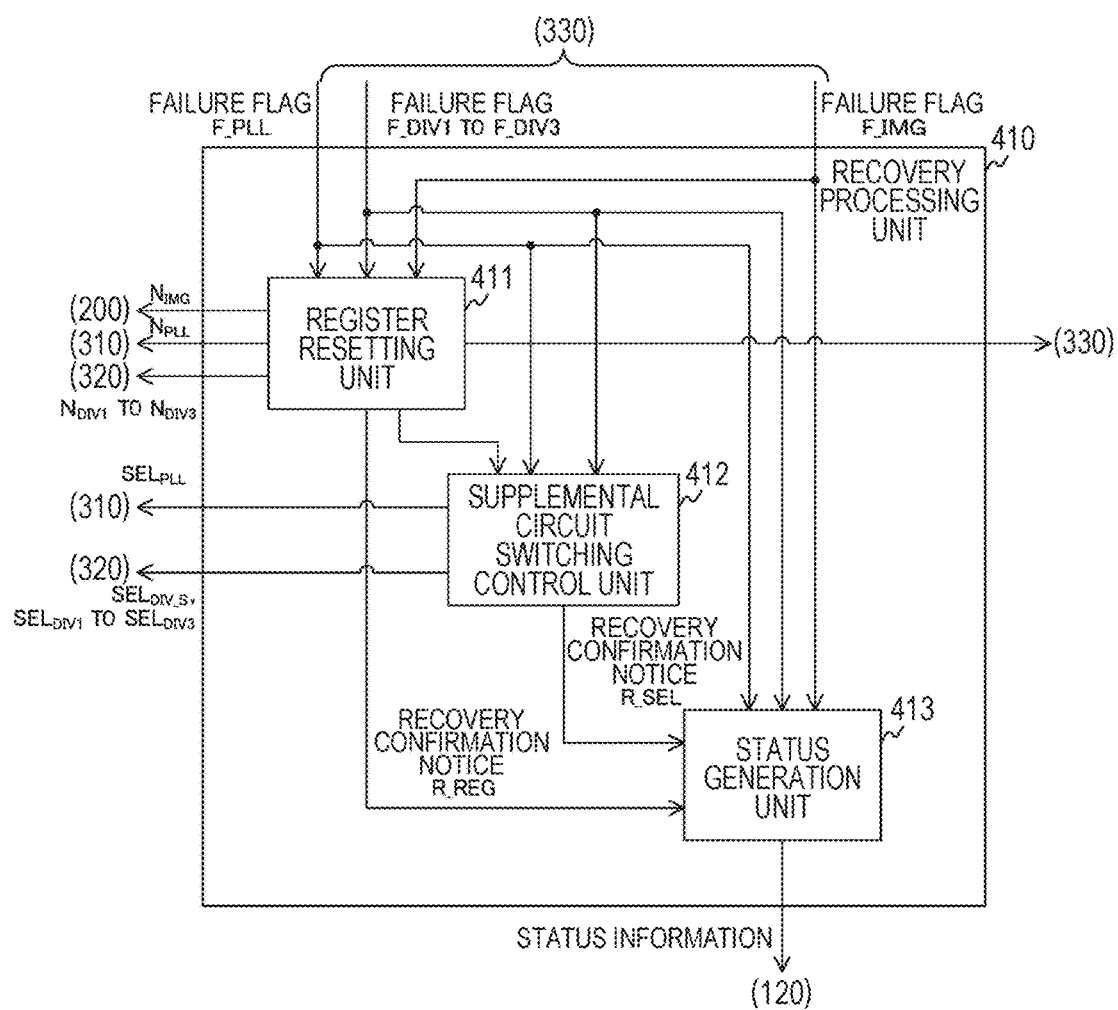
FIG. 12 is a block diagram illustrating a configuration example of a recovery processing unit in the first embodiment of the present technology.

FIG. 12 is a block diagram illustrating a configuration example of the recovery processing unit 410 in the first embodiment. The recovery processing unit 410 is provided with a register resetting unit 411, a supplemental circuit switching control unit 412, and a status generation unit 413.

In a case where the block to be monitored fails, the register resetting unit 411 allows the register of the failure part to hold the set value again. The register resetting unit 411 enables the detection enables EN_D1 and EN_D2 at predetermined timing to start detecting the failure. Furthermore, when starting detecting the failure, the counter is reset by the reset signals RST1 and RST2. Furthermore, assuming also a case where the clock signal to be monitored is asynchronous, it is conceivable that an error accumulates at that time. Therefore, in addition to time when the detection is started, the register resetting unit 411 resets the counter each time it is determined whether or not the frequency ratio is substantially constant.

Failure detection is performed periodically, and a period $P_{DET}$ thereof is set within a certain threshold without an effect on a system. For example, the period $P_{DET}$ is set so to be within an imaging period of the image data (frame). For example, when the period $P_{DET}$ is set to approximately ¼ of the imaging period of the frame, processing from the failure detection to the recovery may be completed within the imaging period. A threshold for the period $P_{DET}$ may be appropriately changed according to the frame period and the like.

Here, as described above, the division ratio $N_{IMG}$ is held in the register in the imaging element 200, and the division ratio $N_{PLL}$ is held in the register in the PLL block 310. Furthermore, the frequency division ratios $N_{DIV1}$ to $N_{DIV3}$ are held in the register in the frequency divider block 320. As a cause of the block failure, in addition to breakage of the circuit in the block and disconnection of wiring, data corruption of the register in the block is assumed. When the failure occurs due to the data corruption, it might be possible to recover from the failure if the set value is overwritten in the register.

Therefore, in a case where any one of the failure flags F_IMG, F_PLL, F_DIV1, F_DIV2, and F_DIV3 corresponding to the block in which the register is provided is "1", the register resetting unit 411 overwrites the set value in the corresponding register. In a case where the failure flag F_IMG is "1", the register resetting unit 411 allows the imaging element 200 to hold again (overwrite) the frequency division ratio $N_{IMG}$, and in a case where the failure flag F_PLL is "1", this allows the PLL block 310 to hold again the frequency division ratio $N_{PLL}$. Furthermore, in a case where any one of the failure flags F_DIV1, F_DIV2, and F_DIV3 is "1", the register resetting unit 411 allows the frequency divider block 320 to hold again the frequency division ratio regarding the failure part out of the frequency division ratios $N_{DIV1}$ to $N_{DIV3}$.

Then, the register resetting unit 411 monitors the failure flag after overwriting in the register and determines whether or not the failed block recovers from the failure. At the time of recovering, the register resetting unit 411 supplies a recovery confirmation notice R_REG to the status generation unit 413. On the other hand, when the recovery is unsuccessful, the register resetting unit 411 notifies the supplemental circuit switching control unit 412 of the block of which recovery is unsuccessful to start the switching control.

The supplemental circuit switching control unit 412 performs control to switch the main circuit in the failed block to the supplemental circuit when the recovery by the register overwriting is unsuccessful. In a case where it is not recovered even after the register overwriting when the failure occurs in the circuit, there is a possibility that the main circuit breaks or the wiring is disconnected. In this case, there is a possibility of recovering by switching the main circuit to the supplemental circuit.

Therefore, when the recovery of the PLL block 310 by the register overwriting is unsuccessful, the supplemental circuit switching control unit 412 switches the main PLL to the supplemental PLL by the selection signal $SEL_{PLL}$. Furthermore, when the recovery of the frequency divider block 320 by the register overwriting is unsuccessful, the supplemental circuit switching control unit 412 switches the failed main frequency divider to the supplemental frequency divider by the selection signals $SEL_{DIV\_S}$ and $SEL_{DIV1}$ to $SEL_{DIV3}$.

Then, the supplemental circuit switching control unit 412 monitors the failure flag F_PLL and the failure flags F_DIV1 to F_DIV3 after switching to the supplemental circuit and determines whether or not it recovers from the failure. Then, when it recovers, the supplemental circuit switching control unit 412 supplies a recovery confirmation notice R_SEL to the status generation unit 413.

The status generation unit 413 generates status information. This status information includes an error status of each of the blocks to be monitored. For example, the error status is classified into "normal", "recovering" and "out or order". "Normal" indicates a state in which no failure occurs in the block. "Recovering" indicates a state in which the recovery processing is being executed on the block. "Out of order" indicates that an unrecoverable failure occurs in the block. An initial state of the error status is set to "normal".

When a failure occurs in the block on which the recovery processing may be performed, the status generation unit 413 changes the status of the block from "normal" to "recovering". Then, the status generation unit 413 changes the status from "recovering" to "normal" or "out of order" in accordance with whether the recovery processing is successful.

On the other hand, when a failure occurs in the block on which the recovery processing cannot be performed, the status generation unit 413 changes the status of the block to "out of order". For example, since the crystal oscillator 110 is not provided with the register or the supplemental circuit, it is not possible to perform the recovery processing. Therefore, when a failure occurs in the crystal oscillator 110, the status thereof is "out of order".

Note that although the in-vehicle camera 100 monitors the crystal oscillator 110, the imaging element 200, the PLL block 310, and the frequency divider block 320, this may also monitor the block other than them as long as the block generates the periodic signal such as the clock signal. Furthermore, although the in-vehicle camera 100 monitors all of the crystal oscillator 110, the imaging element 200, the PLL block 310, and the frequency divider block 320, this may also be configured to monitor only a part of them.

Furthermore, although no supplemental circuit is provided in the crystal oscillator 110 and the imaging element 200, it is also possible to provide the supplemental circuit in at least one of them. Furthermore, although the registers are provided in the imaging element 200, the PLL block 310, and the frequency divider block 320, it is also possible that at least one of them is not provided with the register.

Furthermore, although both the PLL block 310 and the frequency divider block 320 are provided with the supplemental circuit, it is also possible that at least one of them is not provided with the supplemental circuit. It is determined whether each block is provided with only the register, only the supplemental circuit, or both the register and supplemental circuit in consideration of importance, safety, cost and the like of the block.

Furthermore, although the recovery processing unit 410 overwrites the register and switches to the supplemental circuit as for the block provided with both the register and the supplemental circuit, it is also possible that the register overwriting is not performed. For example, in a case where it is desired to shorten the time until the recovery processing is completed, or in a case where reliability on the register is high and possibility of data corruption is low, it is also possible that only the switching to the supplemental circuit is performed.

FIG. 13 is a view illustrating an example of a data configuration of the status information in the first embodiment. The status information includes an error status of each block of the imaging element 200, the PLL block 310, the three frequency dividers in the frequency divider block 320, and the crystal oscillator 110. In the initial state, all the error statuses are set to "normal".

When a failure occurs in the block (for example, PLL block 310) on which the recovery processing may be performed, the recovery processing unit 410 performs the recovery processing including the register overwriting and switching to the supplemental circuit. During the recovery processing, the status of the block is set to "recovering". The status of the block of which recovery is failed is set to "out of order".

When a failure occurs in the crystal oscillator 110, the back-end chip 120 outputs an alarm signal as a failure of an entire in-vehicle camera 100.

Note that the configuration of the status information is not limited to that illustrated in FIG. 13. The recovery processing unit 410 may generate the status information including the failure flag and the recovery confirmation notice for each block, for example.

Figure 14:
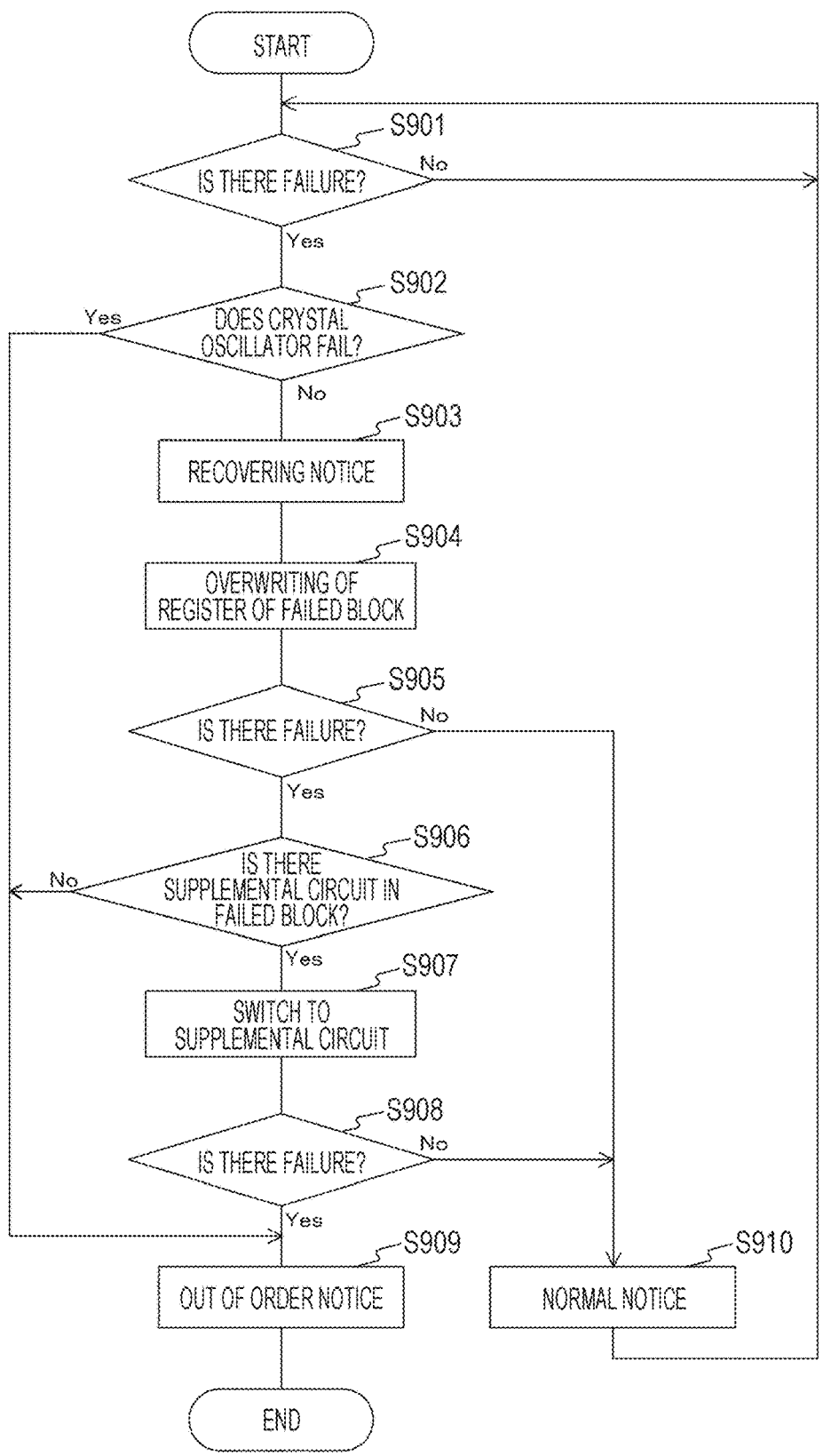
FIG. 14 is a view illustrating an example of operation of the recovery processing unit in the first embodiment of the present technology.

FIG. 14 is a view illustrating an example of operation of the recovery processing unit 410 in the first embodiment. This operation starts, for example, when the in-vehicle camera 100 is powered on. The recovery processing unit 410 refers to the failure flag at detection timing and determines whether or not there is a failure in any block (step S901).

In a case where there is a failure in any of the blocks (step S901: Yes), the recovery processing unit 410 determines whether or not the crystal oscillator 110 fails (step S902). In a case where the failure part is not the crystal oscillator 110 (step S902: No), the recovery processing unit 410 notifies the back-end chip 120 that the block is recovering by the status information (step S903). Then, the recovery processing unit 410 overwrites the register of the failed block (step S904).

After overwriting the register, the recovery processing unit 410 monitors the failure flag of the overwritten block and determines whether there is the failure (step S905). In a case where there is the failure (step S905: Yes), the recovery processing unit 410 determines whether or not there is the supplemental circuit in the block where the failure occurs (step S906). In a case where there is the supplemental circuit (step S906: Yes), the recovery processing unit 410 switches to the supplemental circuit (step S907).

After switching to the supplemental circuit, the recovery processing unit 410 monitors the failure flag of the block in which the switching is performed and determines whether there is the failure (step S908). In a case where the crystal oscillator 110 fails (step S902: Yes), in a case where there is no supplemental circuit (step S906: No), or in a case where there is a failure after switching (step S908: Yes), the recovery processing unit 410 notifies that the block is out of order (step S909).

On the other hand, in a case where there is no failure after the overwriting (step S905: Yes), or there is no failure after switching (step S908: No), the recovery processing unit 410 notifies that the block is normal (step S910). In a case where there is no failure in all the blocks (step S901: No), or after step S910, the recovery processing unit 410 repeatedly executes the processing at step S901 and subsequent steps.

Figure 15:
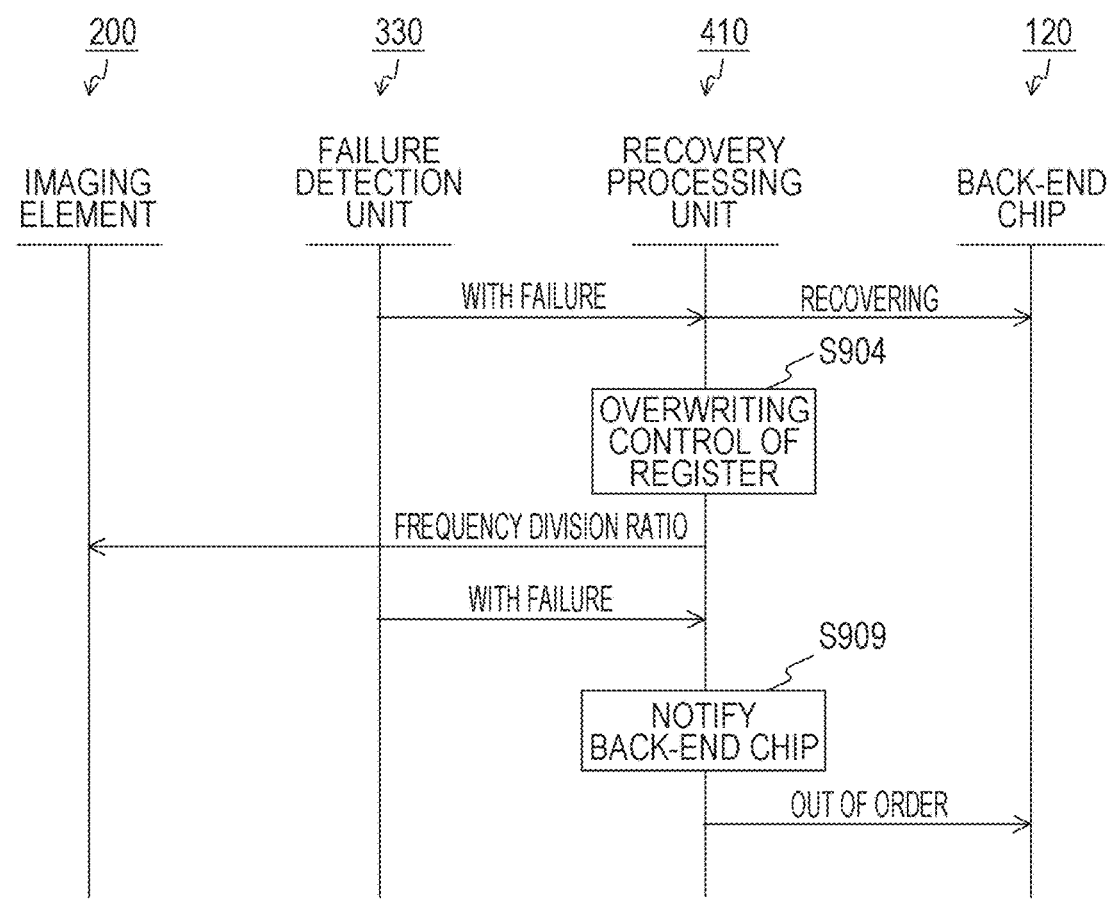
FIG. 15 is a sequence diagram illustrating an example of operation of the in-vehicle camera when the imaging element in the first embodiment of present technology fails.

FIG. 15 is a sequence diagram illustrating an example of operation of the in-vehicle camera 100 when the imaging element 200 in the first embodiment fails. The failure detection unit 330 detects the failure of the imaging element 200 and notifies the recovery processing unit 410 of this by the failure flag. The recovery processing unit 410 notifies the back-end chip 120 that it is recovering, supplies the frequency division ratio to the imaging element 200, and performs register overwriting control (step S904).

Then, when the failure detection unit 330 detects the failure of the imaging element 200 after overwriting the register, the recovery processing unit 410 notifies the back-end chip 120 that the imaging element 200 is out of order (step S909).

In this manner, in a case where there is the register in the failed block, the recovery processing unit 410 tries to recover by overwriting the register.

Figure 16:
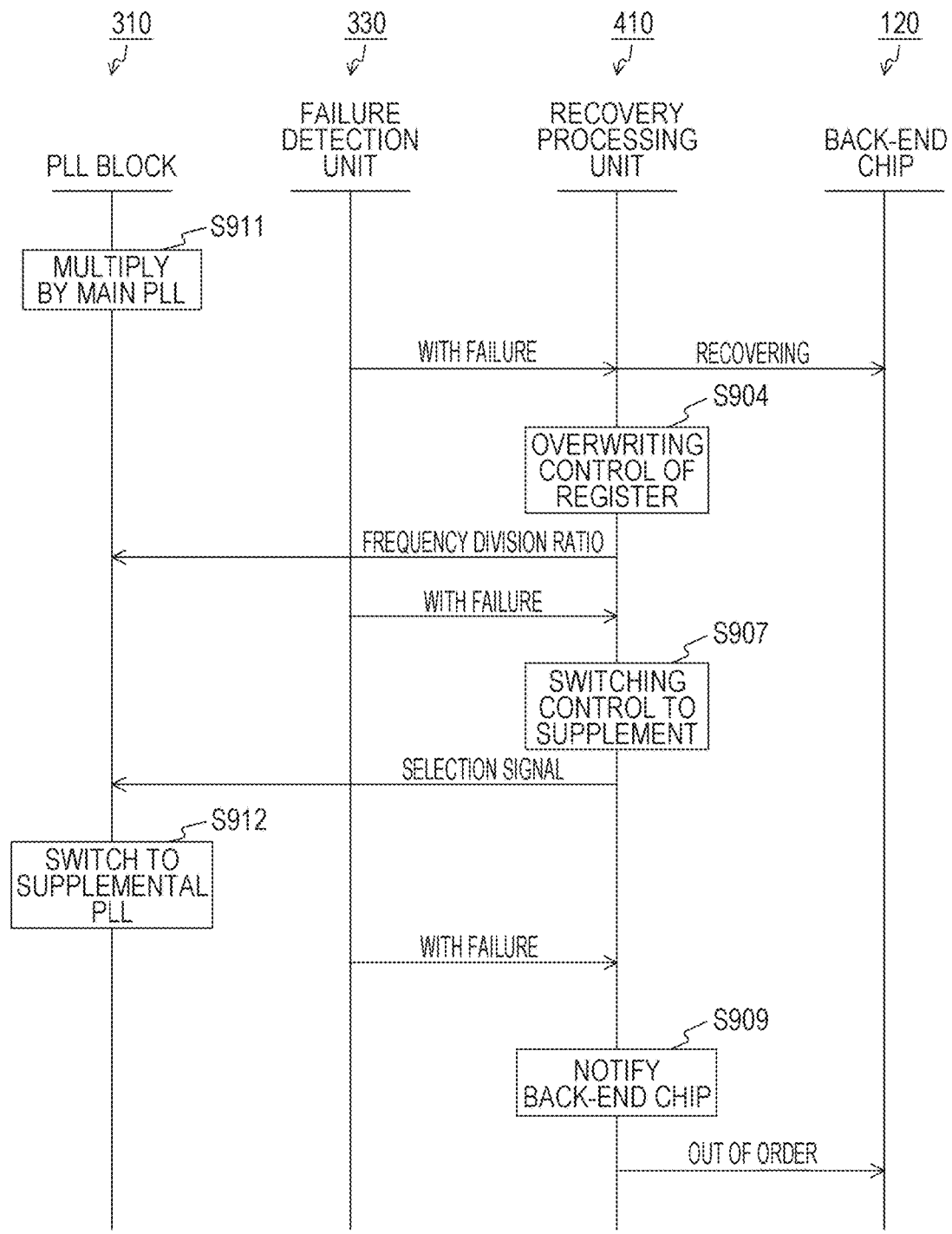
FIG. 16 is a sequence diagram illustrating an example of the operation of the in-vehicle camera when the PLL block in the first embodiment of the present technology fails.

FIG. 16 is a sequence diagram illustrating an example of the operation of the in-vehicle camera when the PLL block 310 in the first embodiment fails. In the PLL block 310 in the initial state, the main PLL multiplies the clock signal $CLK_{X\text{-}tal}$ to generate the clock signal $CLK_{PLL}$ (step S911).

Then, when the failure occurs in the PLL block 310, the failure detection unit 330 notifies the recovery processing unit 410 of the failure of the PLL block 310. The recovery processing unit 410 notifies the back-end chip 120 that it is recovering, supplies the frequency division ratio to the PLL block 310, and performs register overwriting control (step S904).

Then, when the failure detection unit 330 detects the failure of the PLL block 310 after overwriting the register, the recovery processing unit 410 supplies the selection signal to the PLL block 310 and performs switching control to the supplemental circuit (step S907). The PLL block 310 switches to the supplemental PLL according to the selection signal (step S912).

When the failure detection unit 330 detects the failure of the PLL block 310 after switching to the supplemental PLL, the recovery processing unit 410 notifies the back-end chip 120 that the PLL block 310 is out of order (step S909).

As described above, in a case where the failed block includes both the register and the supplemental circuit, the recovery processing unit 410 tries to recover by overwriting the register, and switches to the supplemental circuit when it cannot be recovered.

In this manner, according to the first embodiment of the present technology, the in-vehicle camera 100 specifies the failure part from the three determination flags indicating whether or not the frequency ratio between a pair of clock signals is substantially constant, so that it is possible to correctly determine the state of failure of the circuit which generates the clock signal.

[Variation]

In the first embodiment described above, the failure of the supplemental circuit is not detected before switching to the supplemental circuit. Here, in order to detect the failure, it is necessary to count by a counter for a certain time period as described above. Therefore, in a case where the supplemental circuit already fails before the switching, the failure of the supplemental circuit is detected after a certain time period after the switching and then recovery processing is finished, so that a time until the recovery processing is finished becomes problematically long. An in-vehicle camera 100 according to a variation of the first embodiment is different from that of the first embodiment in that the time until the recovery processing is finished is shortened.

Figure 17:
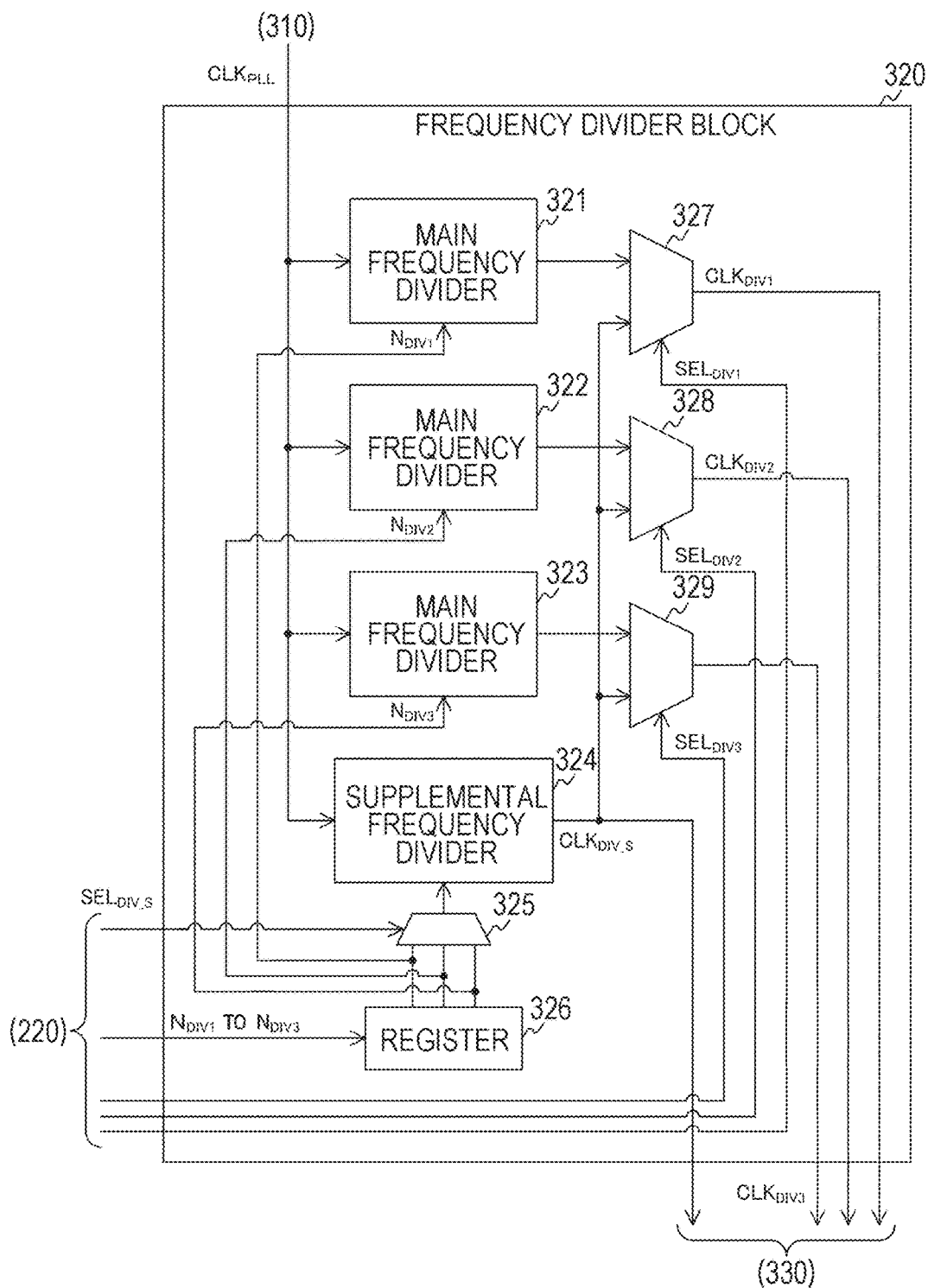
FIG. 17 is a block diagram illustrating a configuration example of a frequency divider block in a variation of the first embodiment of the present technology.

FIG. 17 is a block diagram illustrating a configuration example of a frequency divider block 320 in the variation of the first embodiment. The frequency divider block 320 of this variation is different from that of the first embodiment in that a supplemental frequency divider 324 supplies a clock signal $CLK_{DIV\_S}$ also to a failure detection unit 330 in addition to selectors 327, 328, and 329.

Figure 18:
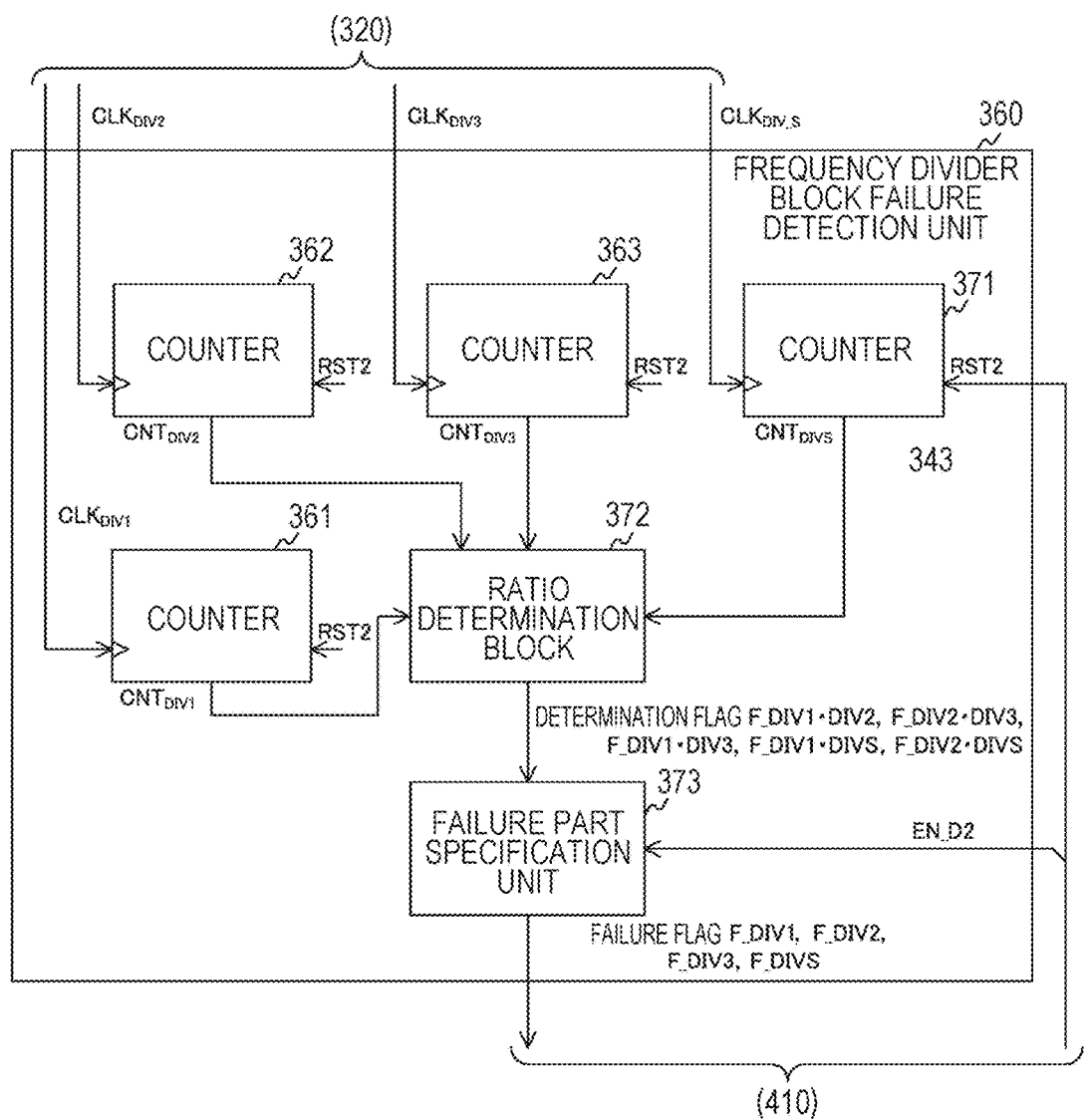
FIG. 18 is a block diagram illustrating a configuration example of a frequency divider block failure detection unit in the variation of the first embodiment of the present technology.

FIG. 18 is a block diagram illustrating a configuration example of a frequency divider block failure detection unit 360 in the variation of the first embodiment. The frequency divider block failure detection unit 360 of this variation is different from that of the first embodiment in including a ratio determination block 372 and a failure part specification unit 373 in place of a ratio determination block 364 and a failure part specification unit 365 and further including a counter 371.

The counter 371 counts a count value $CNT_{DIVS}$ in synchronization with the clock signal $CLK_{DIV\_S}$ from the frequency divider block 320. The counter 371 supplies the count value $CNT_{DIVS}$ to the ratio determination block 372. Furthermore, when a reset signal RST2 is input, the counter 371 sets a count value to an initial value. For example, the recovery processing unit 410 generates the reset signal RST2 in conjunction with detection enable EN_D2 described above.

The ratio determination block 372 generates determination flags F_DIV1·DIV2, F_DIV2·DIV3, F_DIV1·DIV3, F_DIV1·DIVS, and F_DIV1·DIVS from four count values and supplies them to the failure part specification unit 373. Here, the determination flag F_DIV1·DIVS indicates whether or not a ratio between a count value $CNT_{DIV1}$ and the count value $CNT_{DIVS}$ is substantially constant, and the determination flag F_DIV2·DIVS indicates whether or not a ratio between a count value $CNT_{DIV2}$ and the count value $CNT_{DIVS}$ is substantially constant. Note that the ratio determination block 372 generates two determination flags from $CNT_{DIV1}$ and $CNT_{DIV2}$, and $CNT_{DIVS}$, but this may also generate two determination flags from two count values other than a combination of $CNT_{DIV1}$ and $CNT_{DIV2}$, and $CNT_{DIVS}$.

The failure part specification unit 373 generates failure flags F_DIV1, F_DIV2, F_DIV3, and F_DIVS from five determination flags and supplies them to the recovery processing unit 410. The failure flag F_DIVS indicates whether or not the supplemental frequency divider fails. For example, the failure flag F_DIVS is set to "1" in a case where both the determination flags F_DIV1·DIVS and F_DIV2·DIVS are "1".

The recovery processing unit 410 refers to the failure flag F_DIVS before switching to the supplemental frequency divider, and performs the switching when the supplemental circuit does not fail. On the other hand, when the supplemental frequency divider fails, the recovery processing unit 410 sets a status of a corresponding frequency divider to "out of order" without switching and finishes the recovery processing. This makes it possible to shorten the time until the recovery processing is finished when the supplemental circuit fails before the switching.

Note that the failure detection unit 330 does not detect whether or not a supplemental PLL in a PLL block 310 fails, but this may detect the failure also for the supplemental PLL as is the case in the frequency divider block 320.

Figure 19:
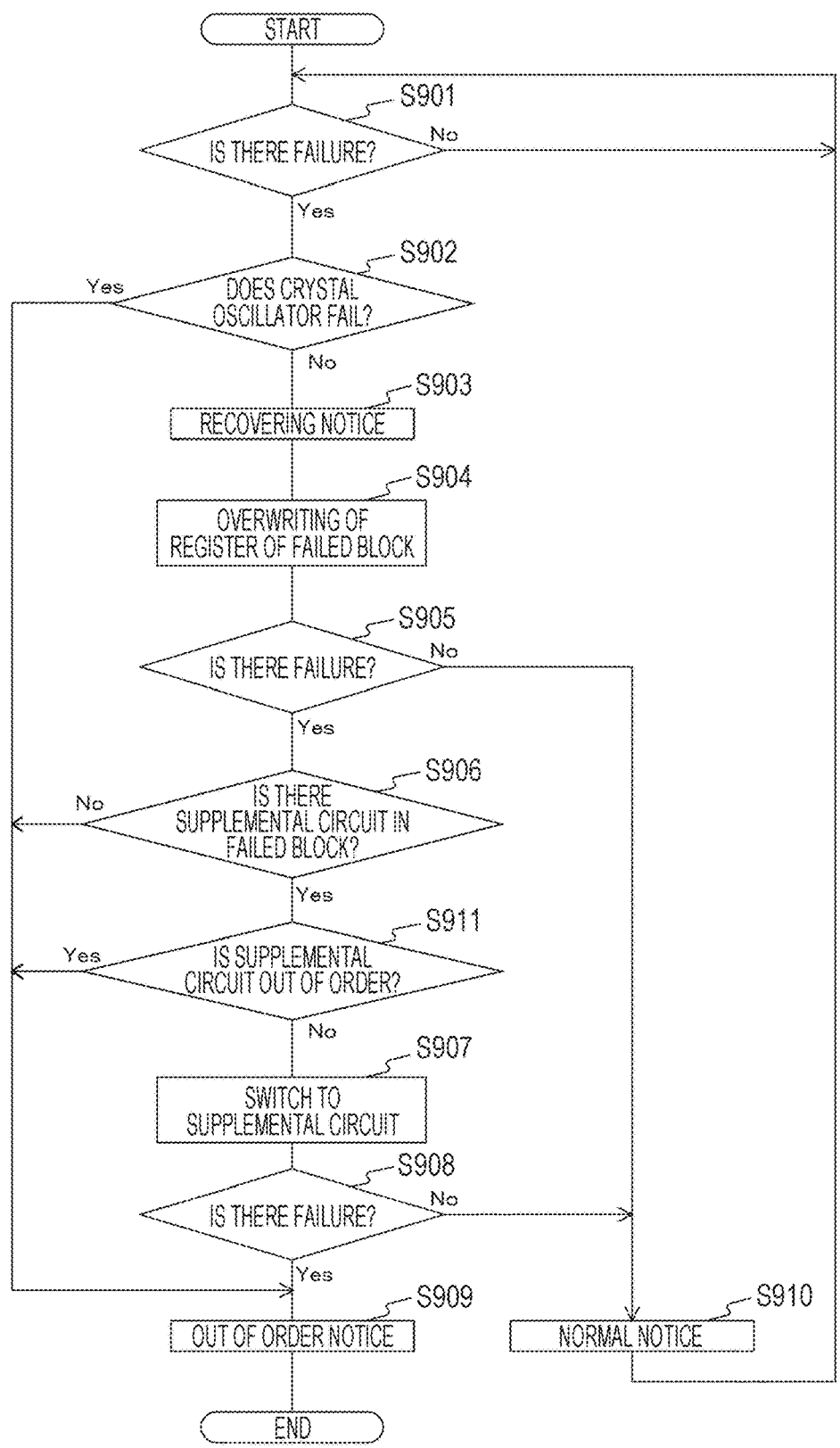
FIG. 19 is a view illustrating an example of operation of a recovery processing unit in the variation of the first embodiment of the present technology.

FIG. 19 is a view illustrating an example of operation of the recovery processing unit 410 in the variation of the first embodiment. The operation of the recovery processing unit 410 in the variation is different from that of the first embodiment in that step S911 is further executed.

In a case where there is the supplemental circuit in the failed block (step S906: Yes), the recovery processing unit 410 determines whether or not the supplemental circuit is out of order (step S911). In a case where the supplemental circuit does not fail (step S911: No), the recovery processing unit 410 switches to the supplemental circuit (step S907). On the other hand, in a case where the supplemental circuit is out of order (step S908: Yes), the recovery processing unit 410 notifies that the block is out of order (step S909).

In this manner, according to the variation of the first embodiment of the present technology, the in-vehicle camera 100 determines whether or not the supplemental frequency divider fails, and switches when this does not fail, so that the time until the recovery processing is finished may be made short.

2. Second Embodiment

In the first embodiment described above, the signal processing chip 300 separately supplies the image data and the status information. However, in this configuration, it is necessary to separately wire the signal line 309 which transmits the image data and the signal line 308 which transmits the status information, so that the number of wires increases. Furthermore, the amount of communication between the signal processing chip 300 and the back-end chip 120 might increase by the status information as compared with a case of transmitting only the image data. An in-vehicle camera 100 according to a second embodiment is different from that of the first embodiment in that the number of wires and the amount of communication between chips are reduced.

Figure 20:
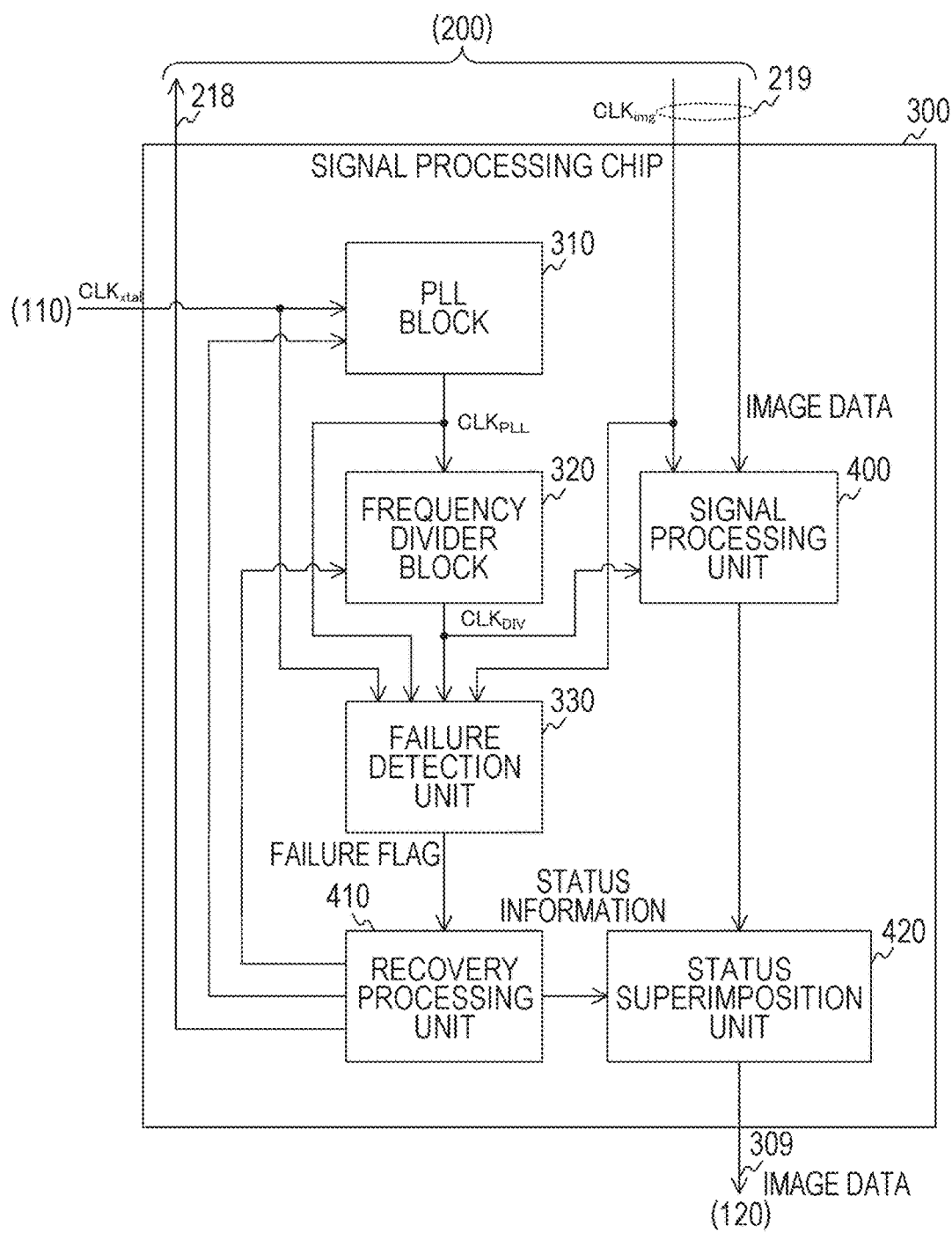
FIG. 20 is a block diagram illustrating a configuration example of a signal processing chip in a second embodiment of the present technology.

FIG. 20 is a block diagram illustrating a configuration example of a signal processing chip 300 in the second embodiment. The signal processing chip 300 of the second embodiment is different from that of the first embodiment in further including a status superimposition unit 420. The status superimposition unit 420 superimposes status information on image data and supplies the same to a back-end chip 120. Note that the status superimposition unit 420 is an example of a superimposition unit recited in claims.

Figure 21:
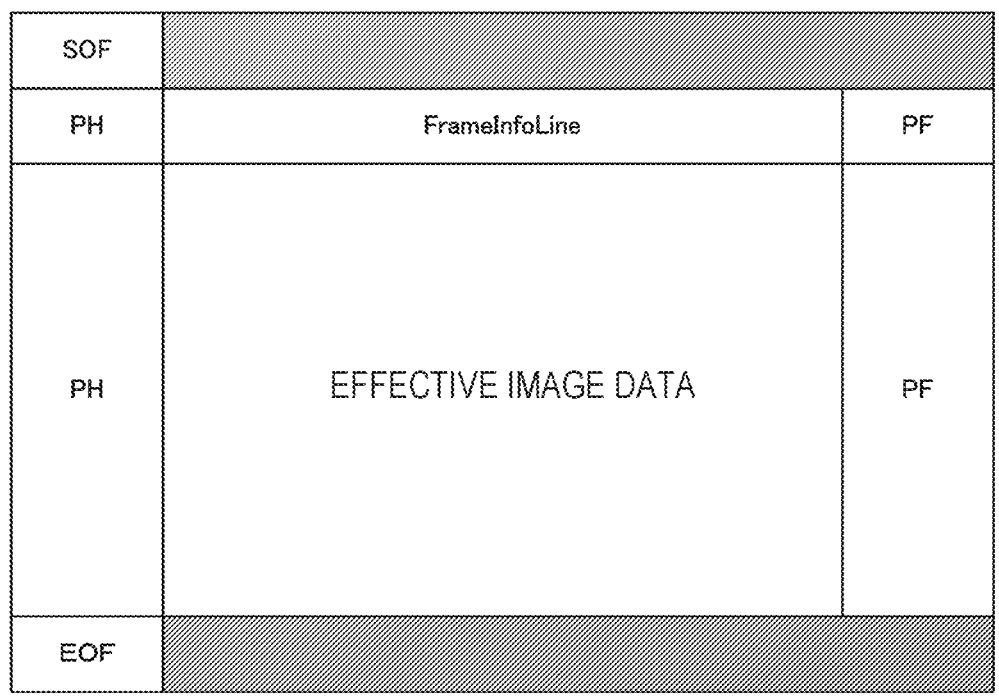
FIG. 21 is a view illustrating an example of a data configuration of image data in the second embodiment of the present technology.

FIG. 21 is a view illustrating an example of a data configuration of the image data in the second embodiment. In the Mobile Industry Processor Interface (MIPI) alliance standard, for example, a start of frame (SOF) is placed at the beginning of the image data. Furthermore, an end of frame (EOF) is placed at the end of the image data. The image data includes a plurality of lines. A packet header (PH) is placed at the beginning of each line, and a packet footer (PF) is placed at the end thereof. Furthermore, the lines are classified into an effective image data output line and an embedded data output line (FrameInfoLine). Various types of information regarding the image data are stored in this FrameInfoLine. The status information is stored in, for example, this FrameInfoLine. Note that a configuration of the image data is not limited to that illustrated in the drawing as long as the status information may be stored.

FIG. 22 is a view illustrating an example of a storage place of the status information in the second embodiment. In FrameInfoLine, the number of data is stored in a position of a first pixel, and a frame count is stored in a position of a second pixel. Then, the status information is stored in a position of a third pixel.

In this manner, according to the second embodiment of the present technology, since the signal processing chip 300 superimposes the status information on the image data and supplies the same to the back-end chip 120, it is possible to reduce the number of wires and the amount of communication between the chips as compared with a case where they are not superimposed.

Note that the above-described embodiments are examples of embodying the present technology, and there is a correspondence relationship between matters in the embodiments and the matters specifying the invention in claims. Similarly, there is a correspondence relationship between the matters specifying the invention in claims and the matters in the embodiments of the present technology assigned with the same names. However, the present technology is not limited to the embodiments and may be embodied by variously modifying the embodiments without departing from the spirit thereof.

Furthermore, the procedures described in the above-described embodiments may be considered as a method including a series of procedures and may be considered as a program for allowing a computer to execute the series of procedures or a recording medium which stores the program. A compact disc (CD), a MiniDisc (MD), a digital versatile disc (DVD), a memory card, a Blu-ray (registered trademark) Disc and the like may be used, for example, as the recording medium.

Note that, the effects herein described are not necessarily limited and may be any of the effects described in the present disclosure.

Note that the present technology may also be configured as follows.

(1) A semiconductor device provided with:

a first periodic signal generation unit which generates a first periodic signal;

a second periodic signal generation unit which generates a second periodic signal from the first periodic signal;

a third periodic signal generation unit which generates a third periodic signal from the first periodic signal;

a determination unit which determines whether or not a frequency ratio between a pair of periodic signals in a group is substantially constant for each of a group of the first and second periodic signals, a group of the second and third periodic signals, and a group of the first and third periodic signals; and a failure part specification unit which specifies the periodic signal generation unit corresponding to the periodic signal commonly included in two groups out of the first, second, and third periodic signal generation units as a failure part in a case where the ratio is not substantially constant in the two groups.

(2) The semiconductor device according to (1) described above, further provided with:

a recovery processing unit which performs recovery processing of recovering the specified failure part.

(3) The semiconductor device according to (2) described above, further provided with:

a register which holds a set value of the ratio in the group for at least one of the groups, in which at least one of the first, second, and third periodic signal generation units generates the periodic signal on the basis of the set value, and the recovery processing includes reset processing of allowing the register to hold again the set value.

(4) The semiconductor device according to (3) described above, further provided with:

a supplemental circuit which generates a supplemental periodic signal, in which the recovery processing includes switching processing of allowing the supplemental circuit to output the supplemental periodic signal to the determination unit in place of the periodic signal corresponding to the failure part out of the first, second, and third periodic signals.

(5) The semiconductor device according to (4) described above, in which the determination unit further determines whether or not the ratio is substantially constant for a group of a plurality of signals out of the first, second, and third periodic signals and the supplemental periodic signal, the failure part specification unit specifies any one of the first, second, and third periodic signal generation units and the supplemental circuit as the failure part, and the recovery processing unit allows the supplemental circuit to output the supplemental periodic signal to the determination unit in place of the periodic signal corresponding to the failure part out of the first, second, and third periodic signals in a case where the supplemental circuit is not failed.

(6) The semiconductor device according to (4) or (5) described above, in which the recovery processing unit performs the switching processing after the reset processing.

(7) The semiconductor device according to any one of (1) to (6) described above, further provided with:

a first counter which counts a first count value in synchronization with the first periodic signal;

a second counter which counts a second count value in synchronization with the second periodic signal; and a third counter which counts a third count value in synchronization with the third periodic signal, in which the determination unit determines whether or not a ratio between a pair of count values in a group is a substantially constant value for each of a group of the first and second count values, a group of the second and third count values, and a group of the first and third count values.

(8) The semiconductor device according to any one of (1) to (7) described above, further provided with:

an imaging unit which takes image data in synchronization with any one of the first, second, and third periodic signals; and a superimposition unit which superimposes information indicating the specified failure part on the image data.

(9) The semiconductor device according to any one of (1) to (8) described above, in which at least one of the first, second, and third periodic signal generation units is a phase synchronization circuit.

(10) The semiconductor device according to any one of (1) to (9) described above, in which at least one of the first, second, and third periodic signal generation units is a frequency divider.

(11) The semiconductor device according to any one of (1) to (10) described above, in which at least one of the first, second, and third periodic signal generation units is a crystal oscillator.

(12) A method of controlling a semiconductor device provided with:

a determining step of determining whether or not a frequency ratio between a pair of periodic signals in a group is substantially constant for each of a group of the first and second periodic signals, a group of the second and third periodic signals, and a group of the first and third periodic signals; and a failure part specifying step of specifying a periodic signal generation unit corresponding to the periodic signal commonly included in two groups out of the first, second, and third periodic signal generation units as a failure part in a case where the ratio is not substantially constant in the two groups.

REFERENCE SIGNS LIST

100 In-vehicle camera
110 Crystal oscillator
120 Back-end chip
200 Imaging element
210 Vertical scanning circuit
220 Pixel array unit
230 Timing control unit
240 Column ADC
250 Horizontal scanning circuit
260, 310 PLL block
261 PLL
262, 313, 326 Register
270 Output unit
300 Signal processing chip
311 Supplemental PLL
312 Main PLL
314, 325, 327, 328, 329 Selector
320 Frequency divider block
321, 322, 323 Main frequency divider
324 Supplemental frequency divider
330 Failure detection unit
340 PLL group failure detection unit
341, 342, 343, 361, 362, 363, 371 Counter
344, 364, 372 Ratio determination block
345, 346, 347 Ratio determination unit
351, 365, 373 Failure part specification unit
360 Frequency divider block failure detection unit
400 Signal processing unit
410 Recovery processing unit
411 Register resetting unit
412 Supplemental circuit switching control unit
413 Status generation unit
420 Status superimposition unit

The invention claimed is:

1. A semiconductor device comprising:
a first periodic signal generation unit which generates a first periodic signal;
a second periodic signal generation unit which generates a second periodic signal from the first periodic signal;
a third periodic signal generation unit which generates a third periodic signal from the first periodic signal;
a determination unit which determines whether or not a frequency ratio between a pair of periodic signals in a group is substantially constant value for each of a group of the first and second periodic signals, a group of the second and third periodic signals, and a group of the first and third periodic signals; and
a failure part specification unit which specifies the periodic signal generation unit corresponding to the periodic signal commonly included in two groups out of the first, second, and third periodic signal generation units as a failure part in a case where the ratio is not substantially constant in the two groups.

2. The semiconductor device according to claim 1, further comprising:
a recovery processing unit which performs recovery processing of recovering the specified failure part.

3. The semiconductor device according to claim 2, further comprising:
a register which holds a set value of the ratio in the group for at least one of the groups,
wherein at least one of the first, second, and third periodic signal generation units generates the periodic signal on the basis of the set value, and
the recovery processing includes reset processing of allowing the register to hold again the set value.

4. The semiconductor device according to claim 3, further comprising:
a supplemental circuit which generates a supplemental periodic signal,
wherein the recovery processing includes switching processing of allowing the supplemental circuit to output the supplemental periodic signal to the determination unit to output in place of the periodic signal corresponding to the failure part out of the first, second, and third periodic signals.

5. The semiconductor device according to claim 4,
wherein the determination unit further determines whether or not the ratio is substantially constant for a group of a plurality of signals out of the first, second, and third periodic signals and the supplemental periodic signal,
the failure part specification unit specifies any one of the first, second, and third periodic signal generation units and the supplemental circuit as the failure part, and
the recovery processing unit allows the supplemental circuit to output the supplemental periodic signal to the determination unit in place of the periodic signal corresponding to the failure part out of the first, second, and third periodic signals in a case where the supplemental circuit is not failed.

6. The semiconductor device according to claim 4,
wherein the recovery processing unit performs the switching processing after the reset processing.

7. The semiconductor device according to claim 1, further comprising:
a first counter which counts a first count value in synchronization with the first periodic signal;
a second counter which counts a second count value in synchronization with the second periodic signal; and
a third counter which counts a third count value in synchronization with the third periodic signal,
wherein the determination unit determines whether or not a ratio between a pair of count values in a group is a substantially constant value for each of a group of the first and second count values, a group of the second and third count values, and a group of the first and third count values.

8. The semiconductor device according to claim 1, further comprising:
an imaging unit which takes image data in synchronization with any one of the first, second, and third periodic signals; and
a superimposition unit which superimposes information indicating the specified failure part on the image data.

9. The semiconductor device according to claim 1,
wherein at least one of the first, second, and third periodic signal generation units is a phase synchronization circuit.

10. The semiconductor device according to claim 1,
wherein at least one of the first, second, and third periodic signal generation units is a frequency divider.

11. The semiconductor device according to claim 1,
wherein at least one of the first, second, and third periodic signal generation units is a crystal oscillator.

12. A method of controlling a semiconductor device comprising:
- a determining step of determining whether or not a frequency ratio between a pair of periodic signals in a group is substantially constant for each of a group of the first and second periodic signals, a group of the second and third periodic signals, and a group of the first and third periodic signals; and
- a failure part specifying step of specifying a periodic signal generation unit corresponding to the periodic signal commonly included in two groups out of the first, second, and third periodic signal generation units as a failure part in a case where the ratio is not substantially constant in the two groups.

* * * * *